(12) United States Patent
Fukuda et al.

(10) Patent No.: US 7,462,379 B2
(45) Date of Patent: *Dec. 9, 2008

(54) LAYER FORMING METHOD, PRODUCT COMPRISING THE LAYER, OPTICAL FILM, DIELECTRIC-COATED ELECTRODE AND PLASMA DISCHARGE APPARATUS

(75) Inventors: Kazuhiro Fukuda, Tokyo (JP); Yoshikazu Kondo, Tokyo (JP); Takashi Murakami, Tokyo (JP); Shunichi Iwamaru, Tokyo (JP); Yumi Muramatsu, Tokyo (JP); Toshio Tsuji, Tokyo (JP)

(73) Assignee: Konica Corporation, Tokyo (JP)

( * ) Notice: Subject to any disclaimer, the term of this patent is extended or adjusted under 35 U.S.C. 154(b) by 586 days.

This patent is subject to a terminal disclaimer.

(21) Appl. No.: 11/089,809

(22) Filed: Mar. 25, 2005

(65) Prior Publication Data

US 2005/0181606 A1 Aug. 18, 2005

Related U.S. Application Data

(62) Division of application No. 10/302,359, filed on Nov. 22, 2002, now Pat. No. 7,044,078, which is a division of application No. 10/181,827, filed as application No. PCT/JP01/10666 on Dec. 6, 2001, now Pat. No. 6,835,425.

(30) Foreign Application Priority Data

Dec. 12, 2000 (JP) ............................. 2000-377044
Jun. 11, 2001 (JP) ............................. 2001-175475

(51) Int. Cl.
*H05H 1/24* (2006.01)

(52) U.S. Cl. ...................... 427/569; 427/576; 427/553; 427/427

(58) Field of Classification Search ................ 427/569, 427/576, 553, 162, 427
See application file for complete search history.

(56) References Cited

U.S. PATENT DOCUMENTS

| | | | |
|---|---|---|---|
| 4,968,918 A | 11/1990 | Kondo et al. | |
| 5,124,173 A * | 6/1992 | Uchiyama et al. | 427/569 |
| 5,192,717 A | 3/1993 | Kawakami et al. | |
| 5,304,407 A * | 4/1994 | Hayashi et al. | 427/569 |
| 5,354,446 A | 10/1994 | Kida et al. | |
| 5,458,856 A | 10/1995 | Marie et al. | |
| 5,543,017 A * | 8/1996 | Uchiyama et al. | 204/169 |
| 5,807,615 A | 9/1998 | Sindzingre et al. | |
| 5,827,275 A | 10/1998 | Morris | |
| 5,856,242 A | 1/1999 | Arai et al. | |
| 5,874,361 A | 2/1999 | Collins et al. | |
| 5,895,558 A * | 4/1999 | Spence | 204/164 |
| 5,909,354 A | 6/1999 | Harada et al. | |
| 5,955,173 A * | 9/1999 | Balmer et al. | 428/142 |
| 6,082,292 A | 7/2000 | Denes et al. | |
| 6,095,084 A | 8/2000 | Shamouilian et al. | |
| 6,106,523 A | 8/2000 | Morris | |
| 6,106,737 A | 8/2000 | Tomoyasu et al. | |
| 6,110,540 A | 8/2000 | Countrywood et al. | |
| 6,118,218 A | 9/2000 | Yializis et al. | |
| 6,134,096 A | 10/2000 | Yamada et al. | |
| 6,284,682 B1 | 9/2001 | Troczynski et al. | |
| 6,537,621 B1 | 3/2003 | Kobayashi et al. | |
| 6,556,657 B1 | 4/2003 | Tybinkowski et al. | |
| 6,652,069 B2 * | 11/2003 | Toda et al. | 347/45 |
| 6,759,100 B2 * | 7/2004 | Fukuda et al. | 427/569 |
| 6,835,425 B2 * | 12/2004 | Fukuda et al. | 427/569 |
| 6,849,306 B2 * | 2/2005 | Fukuda et al. | 427/569 |
| 7,166,335 B2 * | 1/2007 | Fukuda et al. | 427/562 |

FOREIGN PATENT DOCUMENTS

| | | |
|---|---|---|
| EP | 0 298 420 | 1/1989 |
| EP | 997926 A | 5/2000 |
| JP | 10-195665 A | 7/1998 |
| JP | 11-191500 A | 7/1999 |
| JP | 11236676 | 8/1999 |
| JP | 2000-309871 A | 11/2000 |
| JP | 2000-338307 A | 12/2000 |
| JP | 2001-181844 A | 7/2001 |
| WO | WO 97/15719 | 5/1997 |
| WO | WO 99/04411 | 1/1999 |

OTHER PUBLICATIONS

Patent Abstracts of Japan, "Antireflection Film", 2000-338307, Dec. 8, 2000, of 11-150688 (May 28, 1999).
Patent Abstracts of Japan, "Thin Film Deposition System Using Discharge Plasma", 2001-181844, Jul. 3, 2001 of 11-365118 (Dec. 22, 1999).

* cited by examiner

*Primary Examiner*—Bret Chen
(74) *Attorney, Agent, or Firm*—Frishauf, Holtz, Goodman & Chick, P.C.

(57) ABSTRACT

A layer forming method is disclosed which comprises the steps of supplying power of not less than 1 W/cm$^2$ at a high frequency voltage exceeding 100 kHz across a gap between a first electrode and a second electrode opposed to each other at atmospheric pressure or at approximately atmospheric pressure to induce a discharge, generating a reactive gas in a plasma state by the charge, and exposing a substrate to the reactive gas in a plasma state to form a layer on the substrate.

15 Claims, 5 Drawing Sheets

LAYER FORMING METHOD, PRODUCT COMPRISING THE LAYER, OPTICAL FILM, DIELECTRIC-COATED ELECTRODE AND PLASMA DISCHARGE APPARATUS

This application is a Divisional Application of application Ser. No. 10/302,359 filed Nov. 22, 2002, now U.S. Pat. No. 7,044,078, which is a Divisional Application of application Ser. No. 10/181,827 filed Jul. 22, 2002, now U.S. Pat. No. 6,835,425, which is the United States national phase application of International Application PCT/JP01/10666 filed Dec. 6, 2001 which is hereby incorporated in its entirety herein by this reference.

FIELD OF THE INVENTION

The present invention relates to a method of forming various function of layers having high quality, a product with the layer, an optical film with the layer which is an anti-reflection layer, a dielectric coated electrode suitable for forming the layer, and a plasma discharge apparatus comprising the dielectric coated electrode, and particularly to a method of forming a layer on a substrate comprising generating a reactive gas in a plasma state at atmospheric pressure or approximately atmospheric pressure and exposing the substrate to the reactive gas in a plasma state to form a layer on the substrate, a product with the layer, an, optical film, a dielectric coated electrode, and a plasma discharge apparatus.

BACKGROUND OF THE INVENTION

Many materials in which a layer with high function is provided on a substrate are used in various kinds of products, for example, an LSI, a semi-conductor, a displaying device, a magnetic recording device, light to electricity conversion device, a Josephson device, a solar battery, and a light heat conversion device. Examples of the layer with high function include an electrode layer, a dielectric protective layer, a semi-conductor layer, a transparent electro-conductive layer, an electrochromic layer, a fluorescent layer, a superconduction layer, a dielectric layer, a solar battery layer, an anti-reflection layer, an anti-abrasion layer, an optical interference layer, a reflection layer, an anti-static layer, an electroconductive layer, an anti-stain layer, a hard coat layer, a subbing layer, a barrier layer, an electromagnetic radiation shielding layer, an infrared ray shielding layer, a UV absorption layer, a lubricant layer, a shape-memory layer, a magnetic recording layer, a light emission element layer, a layer applied to organisms, an anti-corrosion layer, a catalyst layer, a gas-sensor layer, and a layer for decoration. These layers with high function are formed according to a wet coating method such as a solution coating method or according to a dry coating method employing vacuum processing such as a spattering method, a vacuum evaporation method or an ion plating method.

The solution coating method is advantageous in high productivity, but is not necessarily suitable for formation of a layer with high function, since it is necessary to dissolve or disperse materials constituting the layer in a solvent to prepare a coating solution, and when the coating solution is coated on a substrate to form a layer, the solvent used remains in the resulting layer or it is difficult to obtain a layer with a uniform thickness. The solution coating method further has problem in that at the drying process after coating, the solvent evaporated from the coating solution pollutes environment.

On the other hand, the dry coating method employing vacuum processing can provide a layer with high precision and is preferable in forming a layer with high function. However, the dry coating method, when a substrate to be processed is of large size, requires a large-scale vacuum processing apparatus, which is too expensive and time-consuming consuming for evacuation, resulting in disadvantage of lowering of productivity. As a method for overcoming the demerits in that the solution coating method is difficult to provide a layer with high function or use of a vacuum processing apparatus results in lowering of productivity, a method is described in Japanese Patent O.P.I. Publication Nos. 11-133205, 2000-185362, 11-61406, 2000-147209, and 2000-121804, which comprises subjecting a reactive gas to discharge treatment at atmospheric pressure or approximately atmospheric pressure, exciting the reactive gas to a plasma state and forming a layer on a substrate (hereinafter referred to also as an atmospheric pressure plasma method). The atmospheric pressure plasma method disclosed in these publications generates discharge plasma-between two opposed electrodes by applying pulsed electric field with a frequency of from 0.5 to 100 kHz and with a strength of electric field of from 1 to 100 V/cm. However, although a layer with high function can be formed in only a small area according to the atmospheric pressure plasma method disclosed in the aforementioned publications, it is difficult to form a uniform layer over a large area. Further, it has been proved that the layer formed does not sufficiently satisfy performance to be required for a layer with high function. Accordingly, a means for solving these problems occurring in the layer formation as described above has been required.

The present invention has been made in view of the above. An object of the invention is to provide a method of uniformly forming a layer with high function over a large area with high productivity and with high production efficiency, a product comprising the layer, and an optical film comprising the layer, and to provide a dielectric coated electrode and a plasma discharge apparatus for carrying out the method and obtaining the product and the optical film.

DISCLOSURE OF THE INVENTION

The above object of the invention can be attained by each of the following constitutions:

(1) A layer forming method comprising the steps of supplying power of not less than 1 W/cm$^2$ at a high frequency voltage exceeding 100 kHz across a gap between opposed electrodes at atmospheric pressure or at approximately atmospheric pressure to induce a discharge, generating a reactive gas in a plasma state by the charge, and exposing a substrate to the reactive gas in a plasma state to form a layer on the substrate.

(2) The layer forming method as described in item (1), wherein the total power supplied to the electrode exceeds 15 kW.

(3) The layer forming method as described in item (1) or (2), wherein the high frequency voltage has a continuous sine-shaped wave.

(4) The layer forming method as described in any one of items (1) through (3), wherein the substrate is relatively transported to at least one of the electrodes, whereby the layer is formed on the substrate.

(5) The layer forming method as described in any one of items (1) through (4), wherein the substrate is placed between the electrodes, and the reactive gas is introduced to the gap between the electrodes, whereby the layer is formed on the substrate.

(6) The layer forming method as described in item (4) or (5), wherein the length in the transverse direction of a discharge surface of the electrodes is equal to or greater than that in transverse direction of the substrate on which a layer is to be formed, the transverse direction being perpendicular to the transport direction.

(7) The layer forming method as described in item (6), wherein the length in the transport direction of a discharge surface of the electrode is not less than one tenth the length in the transverse direction of a discharge surface of the electrode.

(8) The layer forming method as described in item (7), wherein the discharge surface area of the electrode is not less than 1000 cm$^2$.

(9) The layer forming method as described in any one of items (1) through (8), wherein at least one on one side of the electrodes is a dielectric coated electrode whose discharge surface is coated with a dielectric to form a dielectric layer.

(10) The layer forming method as described in item (9), wherein the dielectric layer is one formed by thermally spraying ceramic to form a ceramic layer and sealing the ceramic layer with an inorganic compound.

(11) The layer forming method as described in item (10), wherein the ceramic is alumina.

(12) The layer forming method as described in item (10) or (11), wherein the inorganic compound for the sealing is hardened by a sol-gel reaction.

(13) The layer forming method as described in item (12); wherein the sol-gel reaction is accelerated by energy treatment.

(14) The layer forming method as described in item (13), wherein the energy treatment is heat treatment at not more than 200° C. or UV irradiation treatment.

(15) The layer forming method as described in any one of items (12) through (14), wherein the inorganic compound for the sealing after the sol-gel reaction contains not less than 60 mol % of $SiO_x$.

(16) The layer forming method as described in any one of items (9) through (15), wherein the dielectric layer has a void volume of not more than 10% by volume.

(17) The layer forming method as described in item (16), wherein the dielectric layer has a void volume of not more than 8% by volume.

(18) The layer forming method as described in any one of items (9) through (17), wherein the dielectric coated electrode has a heat resistant temperature of not less than 100° C.

(19) The layer forming method as described in any one of items (9) through (18), wherein the dielectric coated electrode has the dielectric layer on a conductive base material, and the difference in a linear thermal expansion coefficient between the conductive base material and the dielectric is not more than $10 \times 10^{-6}$/° C.

(20) The layer forming method as described in any one of items (9) through (19), wherein the dielectric has a dielectric constant of from 6 to 45.

(21) The layer forming method as described in any one of items (1) through (20), wherein at least one electrode on one side of the electrodes has a cooling means comprising a path for chilled water in the interior, the at least one electrode being cooled by supplying chilled water to the path.

(22) The layer forming method as described in any one of items (1) through (21), wherein the substrate is a long-length film, at least one electrode on one side of the opposed electrodes is a roll electrode, which contacts the film and is rotated in the transport direction of the film, and the other electrode being opposed to the roll electrode is an electrode group comprising plural electrodes.

(23) The layer forming method as described in item (22), wherein each of the plural electrodes is prismatic.

(24) The layer forming method as described in item (22) or (23), wherein the surface on the side contacting the substrate of the roll electrode is subjected to polishing treatment.

(25) The layer forming method as described in item (24), wherein the surface on the side contacting the substrate of the roll electrode has a surface roughness Rmax of not more than 10 μm.

(26) The layer forming method as described in any one of items (22) through (25), wherein air, which is introduced to the gap between the opposed electrodes together with the long-length film transported to the gap, is less than 1% by volume.

(27) The layer forming method as described in any one of items (22) through (26), wherein at least one power source is coupled between the one roll electrode and the electrode group, and the power source is capable of supplying a total power of not less than 15 kW.

(28) The layer forming method as described in any one of items (1) through (27), wherein a mixed gas containing an inert gas and the reactive gas is introduced to a gap between the electrodes and the mixed gas contains 90 to 99.9% by volume of the inert gas.

(29) The layer forming method as described in item (28), wherein the mixed gas contains not less than 90% by volume of an argon gas.

(30) The layer forming method as described in item (28) or (29), wherein the mixed gas contains 0.01 to 5% by volume of a component selected from oxygen, ozone, hydrogen peroxide, carbon dioxide, carbon monoxide, hydrogen and nitrogen.

(31) The layer forming method as described in any one of items (1) through (30), wherein the reactive gas contains a component selected from an organometallic compound and an organic compound.

(32) The layer forming method as described in item (31), wherein the organometallic compound comprises a metal selected from Li, Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Cd, In, Ir, Sn, Sb, Cs, Ba, La, Hf, Ta, W, Tl, Bi, Ce, Pr, Nd, Pm, Eu, Gd, Tb, Dy, Ho, Er, Tm, Yb, and Lu.

(33) The layer forming method as described in item (32), wherein the organometallic compound is one selected from a metal alkoxide, an alkylated metal, and a metal complex.

(34) The layer forming method as described in any one of items (1) through (33), wherein the layer contains a compound selected from a metal, a metal oxide, a metal nitride, a metal carbide, and a metal boride.

(35) The layer forming method as described in item (34), wherein the layer contains a compound selected from a metal, a metal oxide, a metal nitride, and a metal boride.

(36) The layer forming method as described in item (35), wherein the layer contains a metal oxide.

(37) The layer forming method as described in item (35) or (36), wherein the layer has a carbon content of from 0.1 to 5% by weight.

(38) The layer forming method as described in item (37), wherein the layer has a carbon content of from 0.2 to 5% by weight.

(39) The layer forming method as described in item (38), wherein the layer has a carbon content of from 0.3 to 3% by weight.

(40) The layer forming method as described in any one of items (1) through (39), wherein the layer has a thickness of from 0.1 to 1000 nm.

(41) The layer forming method as described in any one of items (1) through (40), wherein the layer is one selected from an electrode layer, a dielectric protective layer, a semi-conductor layer, a transparent electro-conductive layer, an electro-chromic layer, a fluorescent layer, a superconduction layer, a dielectric layer, a solar battery layer, an anti-reflection layer, an anti-abrasion layer, an optical interference layer, a reflection layer, an anti-static layer, an electroconductive layer, an anti-stain layer, a hard coat layer, a subbing layer, a barrier layer, an electromagnetic radiation shielding layer, an infrared ray shielding layer, a UV absorption layer, a lubricant layer, a shape-memory layer, a magnetic recording layer, a light emission element layer, a layer applied to organisms, an anti-corrosion layer, a catalyst layer, a gas-sensor layer, and a layer for decoration.

(42) The layer forming method as described in item (41), wherein the layer is an anti-reflection layer.

(43) The layer forming method as described in item (20), wherein the substrate contains cellulose ester as a material.

(44) A product having on a substrate a layer formed according to the layer forming method as described in any one of items (1) through (43).

(45) The product as described in item (44), which is an optical film having an anti-reflection layer.

(46) The product as described in item (45), wherein the anti-reflection layer comprises a high refractive index layer with a refractive index of 1.6 to 2.4 containing titanium oxide as a main component and a low refractive index layer with a refractive index of 1.3 to 1.5 containing silicon oxide as a main component.

(47) The product as described in item (46), wherein the refractive index of the high refractive index layer is not less than 2.2.

(48) A product having on a substrate a layer containing a metal oxide as a main component, wherein the metal oxide layer has a carbon content of from 0.1 to 5% by weight.

(49) The product as described in item (48), wherein the metal oxide layer has a carbon content of from 0.2 to 5% by weight.

(50) The product as described in item (49), wherein the metal oxide layer has a carbon content of from 0.3 to 3% by weight.

(51) The product as described in any one of items (48) through (50), wherein the metal oxide is titanium oxide.

(52) The product as described in item (51), wherein the layer containing titanium oxide as a main component has a refractive index of not less than 2.2.

(53) The product as described in any one of items (48) through (52), wherein the metal oxide is silicon oxide.

(54) An optical film having on a substrate an anti-reflection layer, wherein the anti-reflection layer comprises a high refractive index layer with a refractive index of not less than 2.2, and the high refractive index layer contains titanium oxide as a main component and has a carbon content of from 0.1 to 5% by weight.

(55) The optical film as described in item (54), wherein the high refractive index layer has a carbon content of from 0.2 to 5% by weight.

(56) The optical film as described in item (55), wherein the high refractive index layer has a carbon content of from 0.3 to 3% by weight.

(57) The optical film as described in any one of items (54) through (56), wherein the anti-reflection layer further comprises a low refractive index layer with a refractive index of from 1.3 to 1.5 containing silicon oxide as a main component.

(58) The optical film as described in any one of items (54) through (57), wherein the substrate contains cellulose ester.

(59) The optical film as described in item (58), wherein the substrate contains a plasticizer.

(60) The optical film as described in item (58) or (59), wherein the substrate has a clear hard coat layer or an antiglare layer on its surface.

(61) A dielectric coated electrode, in which a conductive base material is coated with a dielectric to form a dielectric layer, wherein the dielectric layer has a void volume of not more than 10% by volume.

(62) The dielectric coated electrode as described in item (61), in which a conductive base material is coated with a dielectric to form a dielectric layer, wherein the dielectric layer has a void volume of not more than 8% by volume.

(63) The dielectric coated electrode as described in item (61) or (62), wherein the electrode has a heat resistant temperature of not less than 100° C.

(64) The dielectric coated electrode as described in any one of items,(61) through (63), wherein the difference in a linear thermal expansion coefficient between the conductive base material and the dielectric layer in the dielectric coated electrode is not more than $10 \times 10^{-6}$/° C.

(65) The dielectric coated electrode as described in any one of items (61) through (64), wherein the dielectric layer has a thickness of from 0.5 to 2 mm.

(66) The dielectric coated electrode as described in any one of items (61) through (65), wherein the dielectric is an inorganic compound having a dielectric constant of from 6 to 45.

(67) The dielectric coated electrode as described in any one of items (61) through (66), wherein the dielectric layer is one formed by thermally spraying ceramic on the conductive base material to form a ceramic layer, and sealing the ceramic layer with an inorganic compound.

(68) The dielectric coated electrode as described in item (67) wherein the ceramic comprises alumina as a main component.

(69) The dielectric coated electrode as described in item (67) or (68), wherein the inorganic compound for the sealing is hardened by a sol-gel reaction.

(70) The dielectric coated electrode as described in item (69), wherein the sol-gel reaction is accelerated by energy treatment.

(71) The dielectric coated electrode as described in item (70), wherein the energy treatment is heat treatment at not more than 200° C. or UV radiation treatment.

(72) The dielectric coated electrode as described in any one of items (69) through (71), wherein the inorganic compound for the sealing after the sol-gel reaction contains not less than 60 mol % of $SiO_x$.

(73) The dielectric coated electrode as described in any one of items (61) through (72), wherein the surface of the dielectric layer is surface finished by polishing treatment.

(74) The dielectric coated electrode as described in item (73), wherein the surface of the dielectric layer has a surface roughness Rmax of not more than 10 μm.

(75) The dielectric coated electrode as described in any one of items (61) through (74), wherein the electrode has a cooling means comprising a path for chilled water in the interior of the conductive base material, the electrode being cooled by supplying chilled water to the path.

(76) The dielectric coated electrode as described in any one of items (61) through (75), wherein the electrode is prismatic.

(77) A plasma discharge apparatus providing a substrate at a gap between opposed electrodes, applying voltage across the gap at atmospheric pressure or approximately atmospheric pressure to induce a discharge, generating a reactive gas in a plasma state by the charge, and then exposing the substrate to the reactive gas in a plasma state to form a layer on the substrate, wherein the electrode on at least one side of the opposed electrodes is the dielectric coated electrode as described in any one of items (61) through (76).

(78) The plasma discharge apparatus as described in item (77), wherein the substrate is a long-length film, the electrode on at least one side of the opposed electrodes is one roll electrode, which contacts the long-length film and is rotated in the transport direction of the long-length film, and the other electrode opposed to the one roll electrode is an electrode group comprising two or more of the dielectric coated electrode.

(79) The plasma discharge apparatus as described in item (78), wherein the roll electrode is the dielectric coated electrode.

(80) The plasma discharge apparatus as described in item (78) or (79), wherein the surface contacting the film of the roll electrode has a surface roughness Rmax of not more than 10 μm.

(81) The plasma discharge apparatus as described in any one of items (77) through (80), wherein the discharge surface area of the electrode is not less than 1000 cm$^2$.

(82) The plasma discharge apparatus as described in any one of items (77) through (81), wherein the length of the electrode is greater than that of the substrate.

(83) The plasma discharge apparatus as described in any one of items (77) through (81), wherein at least one power source is coupled between the one roll electrode and the electrode group, and the power source is capable of supplying a total power of not less than 15 kW.

(84) A plasma discharge apparatus providing a substrate at a gap between opposed electrodes, applying voltage across the gap at atmospheric pressure or approximately atmospheric pressure to induce a discharge, generating a reactive gas in a plasma state by the charge, and then exposing the substrate to the reactive gas in a plasma state to form a layer on the substrate, wherein the substrate is a long-length film, the electrode on at least one side of the opposed electrodes is a roll electrode, which contacts the long-length film and is rotated in the transport direction of the long-length film, the other electrode opposed to the roll electrode is a dielectric coated electrode, in which a dielectric is coated on a conductive base material to form a dielectric layer, and the surface contacting the film of the roll electrode has a surface roughness Rmax of not more than 10 μm.

(85) The plasma discharge apparatus as described in item (84), wherein the surface contacting the film of the roll electrode is subjected to polishing treatment.

(86) A plasma discharge apparatus comprising the dielectric coated electrode as described in any one of items (61) through (76).

BEST MODE FOR CARRYING OUT THE INVENTION

The present invention will be detailed below.

The layer forming method of the invention comprises supplying power (output density) of not less than 1 W/cm$^2$ at a high frequency voltage exceeding 100 kHz across a gap between opposed electrodes, and exciting a reactive gas to generate plasma. In the invention, the upper limit of the frequency of the high frequency voltage applied across a gap between opposed electrodes is preferably not more than 150 MHz. The lower limit of the frequency of the high frequency voltage is preferably not less than 200 kHz, and more preferably not less than 800 kHz. The lower limit of power supplied across a gap between opposed electrodes is preferably not less than 1.2 W/cm$^2$, and the upper limit of power supplied across a gap between opposed electrodes is preferably not more than 50 W/cm$^2$, and more preferably not more than 20 W/cm$^2$. The discharge surface area. (cm$^2$) refers to the surface area of the electrode at which discharge occurs. When a high voltage is applied at a high frequency and at a high output density as in the invention, the discharge surface area corresponds to the total area of the discharge surface of electrode arranged on one side. The output density is obtained by dividing the total power supplied from a power source coupled to the electrodes with the total area above.

Figure 6:
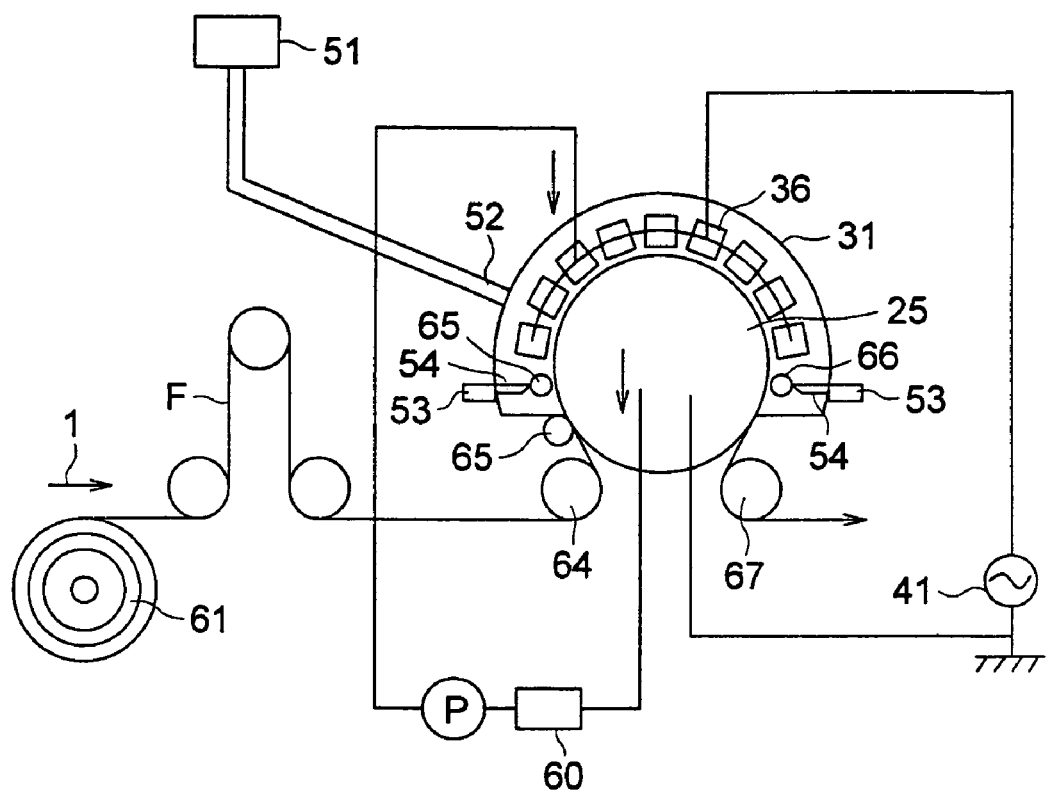
FIG. 6 shows one embodiment of a plasma discharge apparatus used in the layer forming method of the invention.

In the invention, in order to form a layer with a uniform thickness over a large area, the total power supplied to a set of opposed electrodes is preferably more than 15 kW, more preferably not less than 30 kW, and most preferably not less than 50 kW. The total power is preferably not more than 300 kW, in view of heat generation. The total power herein referred to corresponds to power supplied from a power source coupled to the set of the opposed electrodes. When two or more power sources are coupled to the electrode set above, the total power is the sum of power supplied from each of the power sources. For example, in the plasma discharge apparatus in FIG. 6 described later, the total power is a power supplied from power source 41 which is coupled to a set of opposed electrodes composed of roll electrode 25 and prismatic electrodes 36. In FIG. 6, when the surfaces of the prismatic electrodes 36, facing the roll electrode 25, are discharge surfaces of voltage application electrodes, the discharge surface area is the sum of the areas of the discharge surfaces. When electrodes are cylindrical as electrodes 26 shown in FIG. 1, the discharge surface area is the sum of the projected areas of the cylindrical electrodes 26 onto the roll electrode 36.

In order to satisfy the total power range in the invention, it is necessary that the discharge surface area is relatively large. The high frequency voltage applied to the electrodes may be a continuous sine wave or a discontinuous pulsed wave. The continuous sine wave is preferred in securing the effects of the invention. It is advantageous in attaining the object of the invention of forming a uniform layer with high density and without unevenness that the electrode is arranged so that the discharge surface of the electrode faces the substrate surface on which the layer is to be formed. Accordingly, the substrate is preferably provided between the electrodes.

It is preferred in forming a uniform layer with high performance and without unevenness that the length in at least one direction of the electrode discharge surface is equal to or greater than that in the direction of the substrate surface on which the layer is to be formed, the direction being the same as the electrode discharge surface. When a substrate is transported relatively to the electrode to form a layer on the substrate, it is preferred that in the direction perpendicular to the transport direction of the substrate, the length of the electrode discharge surface is equal to or greater than that of the substrate surface on which the layer is to be formed. Thus, according to the method in which the substrate is transported relatively to the electrode to form a layer on the substrate, it is possible to form a layer over a large area at high speed simply by moving the substrate or the electrode in one direction. The above means that, for example in the plasma discharge apparatus of FIG. 6, the length in the transverse direction (the direction perpendicular to the paper surface plane) of the discharge surface of the roll electrode 25 and the prismatic electrodes 36 is equal to or greater than that of the substrate F. In FIG. 6, the length of roll electrode 25 and the prismatic electrodes 36 is equal to that of the substrate F. When a layer is formed on a substrate being transported relatively to the electrode in the layer forming method of the invention, the length in the transport direction of the electrode discharge surface is preferably not less than one tenth, more preferably not less than one fifth, and still more preferably not less than one-half of the length in the transverse direction of the electrode discharge surface. This means that the longer length in the transport direction of the electrode discharge surface is preferred, whereby a layer having a uniform thickness with high performance and without unevenness is formed. The longer length in the transport direction of the electrode discharge surface increases the discharge surface area, resulting in an increase of total power.

For example, in manufacturing an anti-reflection film employing a 100 cm wide long-length film as a substrate, a layer is formed while transporting the long-length film. In this example, when the length in the transverse direction of the electrode discharge surface, the direction being perpendicular to the film transport direction, is 100 cm, the length in the transport direction of the electrode discharge surface is not less than 10 cm, preferably not less than 12.5 cm and still more preferably not less than 30 cm. It is preferred that the discharge surface faces the substrate surface on which the layer is to be formed. In view of the above, the area of the discharge surface of the electrode is preferably not less than 1000 $cm^2$, more preferably not less than 1300 $cm^2$, still more preferably not less than 1800 $cm^2$, and most preferably not less than 3000 $cm^2$.

The present inventors have found that a layer with high density, with a uniform thickness, with high performance and without unevenness can be obtained with high production efficiency applying a high power electric field to a large area as described above. The present inventors assume that the excellent effects result from the fact that plasma with high density can be uniformly generated over a large area according to the discharge method as described above.

It is necessary in the invention that a plasma discharge apparatus be installed with electrodes with high durability which are capable of maintaining uniform discharge even when such a high electric field is applied to a large surface area of the electrodes at atmospheric pressure or at approximately atmospheric pressure. Such electrodes are preferably those in which a dielectric is coated on at least the discharge surface of the surfaces of conductive base materials such as metals. A dielectric is coated on at least one of a voltage application electrode and a grounding electrode opposed to each other, and preferably on both electrodes.

The dielectric coated electrode is a composite material comprised of conductive base material such as metals and a dielectric such as ceramic or glass. When supplied power, particularly total supplied power, is high, the dielectric coated electrode is likely to be damaged at weak portions of the dielectric coat, making it difficult to maintain stable plasma discharge. This phenomenon is particularly marked in a dielectric coated electrode with a large discharge surface, and accordingly in order to carry out a layer forming method employing high power as in the invention, a dielectric coated electrode capable of resisting such a high power is required.

The dielectric used in the dielectric coated electrode of the invention is preferably an inorganic compound having a dielectric constant of from 6 to 45. Examples thereof include ceramic such as alumina or silicon nitride, and a glass lining material such as silicate glass or borate glass. Of these, a dielectric layer is coated on the electrode preferably by thermal spraying of ceramic or by glass-lining, and more preferably by thermal spraying of alumina.

The present inventors have made an extensive study on dielectric coated electrodes, and have found a dielectric coated electrode coated with a dielectric layer having a void volume of not more than 10% by volume, preferably not more than 8% by volume as one embodiment of the electrodes as described above capable of resisting a high electric power. A dielectric layer having a void volume of from more than 0 to 5% by volume is still more preferred. Herein, the void volume of the dielectric layer refers to a volume of voids having openings at the dielectric layer surface in the layer thickness direction, and can be measured employing a mercury porosimeter. In the examples described later, the void volume of a dielectric layer coated on a conductive base material was measured employing a Mercury Porosimeter produced by Shimazu Seisakusho Co., Ltd. The dielectric layer having a low void volume provided high durability. A dielectric layer having voids whose volume is low is, for example, a thermally sprayed ceramic layer with high density and high adhesion prepared according to an atmospheric plasma method as described later. In order to further reduce the void volume, a sealing treatment is preferably carried out.

Another preferred embodiment of the electrodes is a dielectric coated electrode in which a dielectric layer is coated on an electrode by means of a glass lining method employing a glass produced according to a melting method. In this embodiment, a dielectric layer comprised of two or more layers, which differ in foam content, provides higher durability. It is preferred in the embodiment that the foam content of the lowest layer which contacts the conductive base material is 20 to 30% by volume, and the foam content of the layer or layers provided on the lowest layer is not more than 5% by volume. The foam content can be calculated from the density of glass itself and the density of the glass lining layer. The melted glass ordinarily foams but can be defoamed. Accordingly, the foam content can be adjusted to an intended value varying a defoaming degree. The dielectric formed in a layer according to a glass lining method, the foam content of which is controlled, provides an electrode with high durability. In the above embodiment it is preferred that the total thickness of the dielectric layers is 0.5 to 2.0 mm, or the thickness of the lowest layer is not less than 0.1 mm, and the total thickness of the layer or layers provided on the lowest layer is not less than 0.3 mm.

Still another preferred embodiment of the dielectric coated electrodes of the invention capable of resisting high electric power is one having a heat resistant temperature of not less than 100° C., preferably not less than 120° C., and more preferably not less than 150° C. The heat resistant temperature herein refers to a highest temperature capable of carrying out normal discharge without causing dielectric breakdown. The above heat resistant temperature can be attained by employing a dielectric layer formed according to the thermal spray of ceramic as described above, by employing a dielectric layer comprised of two or more layers, which differ in foam content, formed according to the glass-lining as described above, or by properly selecting conductive base materials and dielectrics in which the difference in linear thermal expansion coefficient between the conductive base materials and dielectrics falls within the range as described below.

Still further another preferred embodiment of the dielectric coated electrodes of the invention is a combination of conductive base material and dielectrics in which the difference in linear thermal expansion coefficient between the conductive base material and dielectrics is not more than $10 \times 10^{-6}/°$ C. The difference in linear thermal expansion coefficient between the conductive base materials and dielectrics is preferably not more than $8 \times 10^{-6}/°$ C., more preferably not more than $5 \times 10^{-6}/°$ C., and most preferably not more than $2 \times 10^{-6}/°$ C. Herein, the linear thermal expansion coefficient is a known physical value specific to materials.

Combinations of conductive base materials and dielectric having a difference in linear thermal expansion coefficient between them falling within the range as described above will be listed below.

(1) A combination of pure titanium as conductive base material and a thermal spray ceramic layer as a dielectric layer
(2) A combination of pure titanium as conductive base material and a glass lining layer as a dielectric layer
(3) A combination of titanium alloy as conductive base material and a thermal spray ceramic layer as a dielectric layer
(4) A combination of stainless steel as conductive base material and a glass lining layer as a dielectric layer
(5) A combination of titanium alloy as conductive base material and a thermal spray ceramic layer as a dielectric layer
(6) A combination of stainless steel as conductive base material and a glass lining layer as a dielectric layer
(7) A combination of a composite of ceramic and iron as conductive base material and a thermal spray ceramic layer as a dielectric layer
(8) A combination of a composite of ceramic and iron as conductive base material and a glass lining layer as a dielectric layer
(9) A combination of a composite of ceramic and aluminum as conductive base material and a thermal spray ceramic layer as a dielectric layer
(10) A combination of a composite of ceramic and aluminum as conductive base material and a glass lining layer as a dielectric layer In view of the difference in the linear thermal expansion coefficient, the combinations of (1) through (4), and (7) through (10) above are preferred.

Still another preferred embodiment of the dielectric coated electrodes of the invention capable of resisting high power is a dielectric coated electrode in which the dielectric layer has a thickness of from 0.5 to 2 mm. The variation of the dielectric layer thickness is preferably not more than 5%, more preferably not more than 3%, and still more preferably not more than 1%.

As a method of thermally spraying ceramic as a dielectric onto the above conductive base material with high density and high adhesion, there is an atmospheric plasma spraying method. The atmospheric pressure plasma spraying method refers to a technique in which fine particles or wires of ceramic etc. are introduced into a source of plasma heat to form a melted or semi-melted particles, and the resulting particles are sprayed to a base material on which a layer is to be formed. The source of plasma heat herein referred to is a high temperature plasma gas obtained by heating gas molecules to high temperature to dissociate into atoms and applying further energy thereto to release electrons. The spraying speed of this plasma gas is high, and therefore the sprayed gas colloids the base material with a spray speed higher than that of a conventional arc spraying or a flame spraying, providing a layer with high adhesion and higher density. A spraying method disclosed in Japanese Patent O.P.I. Publication. Nos. 2000-301655 can be referred to in which a heat shielding layer is formed on material heated to high temperature. According to this method, it is possible to form a dielectric layer (thermally sprayed ceramic layer) having a void volume of not more than 10% by volume, and further not more than 8% by volume.

In order to further reduce the void volume of the dielectric layer, it is preferred that a thermally sprayed layer such as the thermally sprayed ceramic layer is subjected to sealing treatment employing an inorganic compound. The inorganic compound is preferably a metal oxide, and more preferably one containing a silicon oxide (SiOx) as a main component.

The inorganic compound for sealing is preferably one being hardened through sol-gel reaction. When an inorganic compound for sealing is a compound containing a metal oxide as a main component, a metal alkoxide is coated on the ceramic spray layer as a sealing solution, and hardened through sol gel reaction. When the inorganic compound for sealing is a compound containing silica as a main component, an alkoxysilane is preferably used as a sealing solution.

In order to accelerate the sol gel reaction, energy treatment is preferably carried out. Examples of the energy treatment include heat hardening (hardening at not more than 200° C.) or UV irradiation. A sealing method, in which the alternate coating and hardening of diluted sealing solution are repeated several times, provides an electrode with improved inorganic property, with high density and without any deterioration.

When in the preparation of the dielectric coated electrode of the invention, a metal oxide solution as a sealing solution is coated on a thermally sprayed ceramic layer and subjected to sealing treatment in which hardening is carried out through sol gel reaction, the metal oxide content after hardening is preferably not less than 60 mol %. When an alkoxysilane is used as a metal alkoxide of a sealing solution, the content of SiOx (x: not more than 2) after hardening is preferably not less than 60 mol %. The content of SiOx (x: not more than 2) after hardening is measured analyzing the section of the dielectric layer through an XPS.

The dielectric layer surface of the dielectric coated electrode is surface finished by polishing treatment so as to obtain a surface roughness Rmax (according to JIS B 0601) of not more than 10 μm, which makes it possible to maintain the dielectric layer thickness or a gap between the electrodes constant, provide stable discharge, and provide an electrode with greatly increased durability, with high precision and without strain or cracking due to thermal shrinkage difference or residual stress. It is preferred that at least the surface of the dielectric layer on the side contacting the substrate is surface finished by polishing.

A plasma discharge apparatus employing such an electrode will be explained below employing FIGS. 1 through 6.

A plasma discharge apparatus is one which induces discharge in a gap between a roll electrode which is a grounding electrode and plural fixed electrodes which are voltage application electrodes and face the roll electrode, introduces a reactive gas to the gap to excite the reactive gas in a plasma state, and exposes a long length substrate provided on the roll electrode to the reactive gas excited in a plasma state to form a layer on the substrate. Herein, the length in the transverse direction (perpendicular to the substrate transport direction) of the electrode is equal to that of the long length substrate. When a layer is formed on the long length substrate within a region in the transverse direction shorter than the substrate width, considering that after the layer formation, the edges in the transverse direction of the substrate are cut off, the length in the transverse direction of the electrode discharge surface may be equal to or greater than that of the region at which the layer is to be formed.

A plasma discharge apparatus carrying out the layer forming method of the invention is not limited to those described above, but may be any one as long as a stable glow discharge is maintained and a reactive gas used for forming the layer is excited into a plasma state. As described above, a method comprising providing a substrate between electrodes and introducing a reactive gas to a gap between the electrodes is preferable in that a large discharge area can be secured, and a layer with a uniform thickness and with high performance can be formed. As another method, there is a jetting method in which a substrate is provided or transported to the vicinity of electrodes but not between the electrodes, and then generated plasma is jetted to the substrate to form a layer on the substrate.

Figure 1:
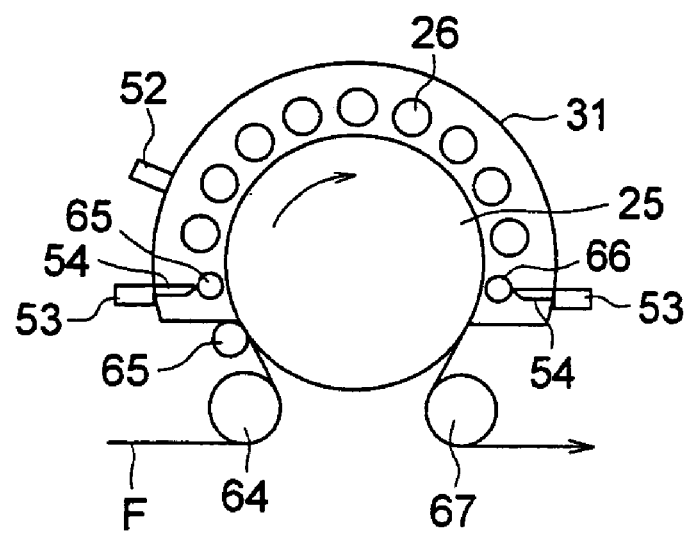
FIG. 1 shows one embodiment of a plasma discharge vessel provided in a plasma discharge apparatus used in the manufacturing method in the invention.

FIG. 1 shows a schematic drawing of one embodiment of the plasma discharge vessel equipped in a plasma discharge apparatus used in the layer forming method of the invention. In FIG. 1, substrate F with long length is transported while wound around roll electrode 25 rotating in the transport direction (clockwise in FIG. 1). Electrodes 26, which are fixed, are composed of plural cylinders and arranged to be opposed to the roll electrode 25. The substrate F, which has been wound around the roll electrode 25, is pressed by nip rollers 65 and 66, transported into a discharge space in the plasma discharge vessel 31 through guide roller 64, subjected to discharge plasma treatment, and then transported into the next process through guide roller 67. Blade 54 is provided at the vicinity of the nip rollers 65 and 66, and prevents air accompanied by the transported substrate F from entering the plasma discharge vessel 31. The volume of the accompanied air is preferably not more than 1% by volume and more preferably 0.1% by volume, based on the total volume of air in the plasma discharge vessel 31, which can be attained by the nip rollers 65 and 66 above.

A mixed gas used in the discharge plasma treatment (an organic gas containing both inert gas and reactive gas such as an organic fluorine-containing compound, a titanium compound, or a silicon compound) is introduced into the plasma discharge vessel 31 from supply port 52, and exhausted from exhaust port 53 after discharge treatment.

Figure 2:
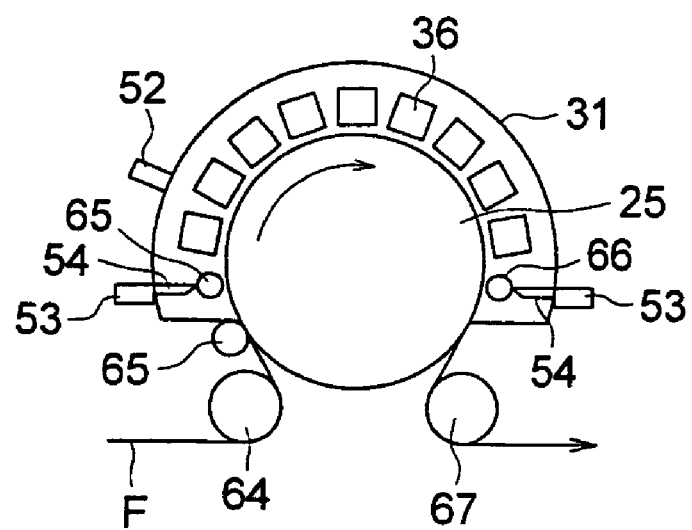
FIG. 2 shows another embodiment of a plasma discharge vessel provided in a plasma discharge apparatus used in the manufacturing method of the invention.

As in FIG. 1, FIG. 2 shows a schematic drawing of another embodiment of the plasma discharge vessel equipped in a plasma discharge apparatus used in the layer forming method of the invention. However, electrodes 26 in FIG. 1, which are fixed and arranged to be opposed to the roll electrode 25, are cylindrical, while electrodes 36 in FIG. 2 are prismatic.

As compared with cylindrical electrodes 26 shown in FIG. 1, prismatic electrodes 36, as shown in FIG. 2, broaden the discharge region (discharge surface area), and are preferably used in the layer forming method of the invention.

Figure 3:
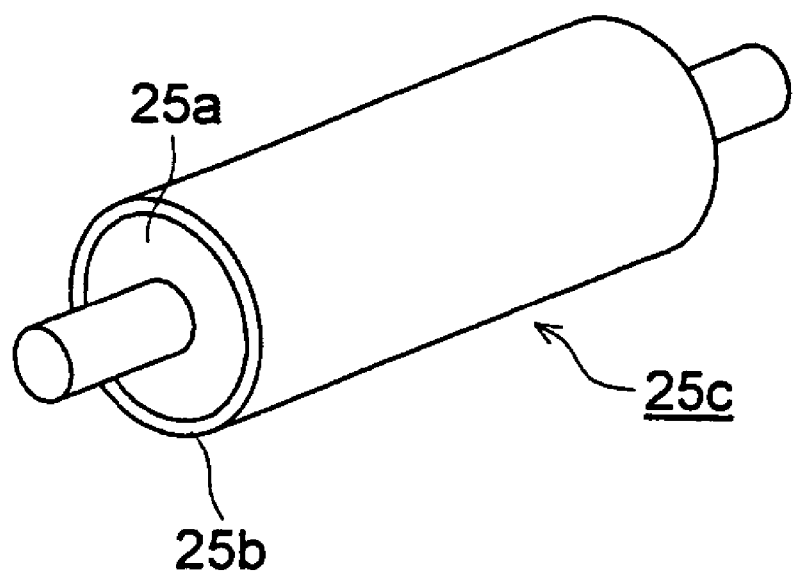
FIG. 3 shows one embodiment of a cylindrical roll electrode used for plasma discharge in the invention.
Figure 4:
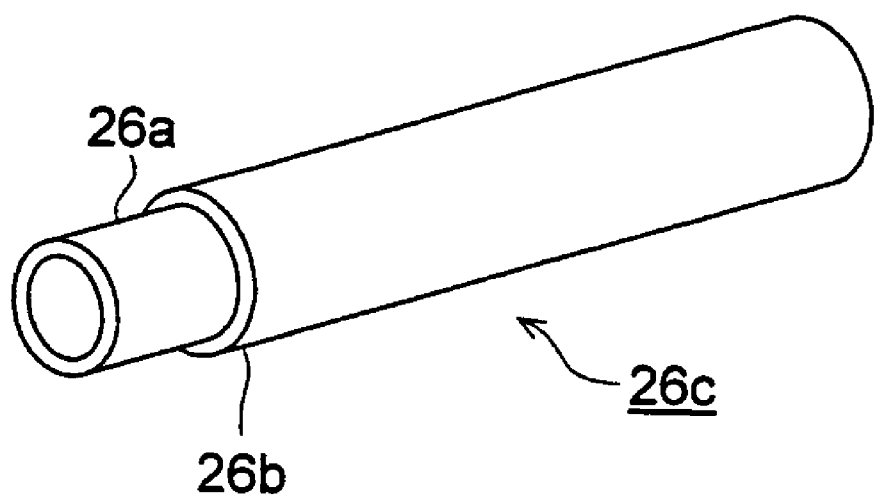
FIG. 4 shows one embodiment of a fixed, cylindrical electrode used for plasma discharge in the invention.
Figure 5:
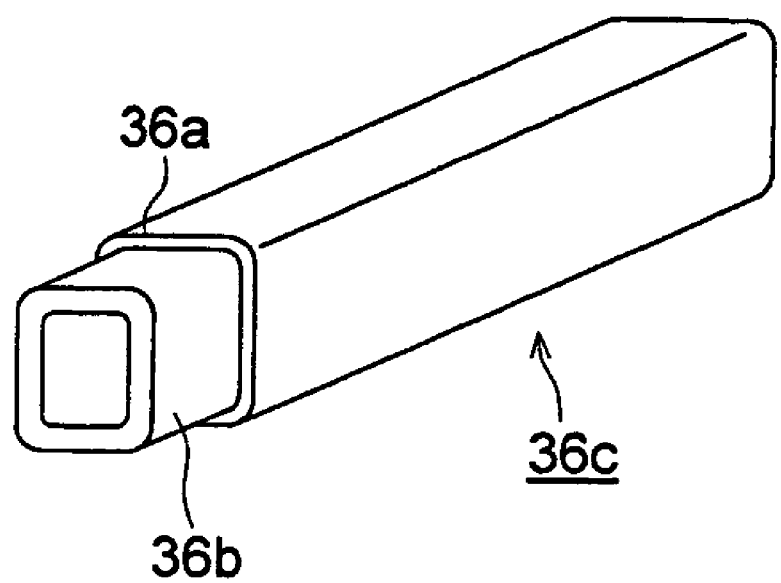
FIG. 5 shows one embodiment of a fixed, prismatic electrode used for plasma discharge in the invention.

FIG. 3 shows a schematic drawing of one embodiment of the cylindrical roll electrode described above, FIG. 4 shows a schematic drawing of one embodiment of a cylindrical, fixed electrode, and FIG. 5 shows a schematic drawing of one embodiment of a prismatic, fixed electrode.

In FIG. 3, roll electrode 25c, which is an electrode to be grounded, is an electrode in which a conductive base roll 25a such as a metal roll is coated with a ceramic dielectric 25b as a dielectric layer, the coating being carried out by thermally spraying ceramic on the base roll to form a ceramic layer, and sealing the ceramic layer with sealing materials such as inorganic compounds. The ceramic dielectric layer has a thickness of 1 mm, and is grounded. The ceramic material used for thermal spraying is preferably alumina, silicon nitride, and more preferably alumina in view of easy processability. The dielectric layer may be provided on a conductive base roll by lining of inorganic materials. Materials for lining include silicate glass, borate glass, phosphate glass, germanate glass, tellurite glass, aluminate glass, and vanadate glass. Among these, borate glass is preferably used in view of easy processability. Examples of a metal used in the conductive base roll 25a include metals such as titanium, silver, platinum, stainless steel, aluminum, or iron, a composite of iron and ceramic, and a composite of aluminum and ceramic. Stainless steel is preferable in view of processability.

In one embodiment carried out in the invention, a base roll for the roll electrode employs a stainless steel jacket roll having a cooling means (not illustrated in Figs.) employing chilled water. FIGS. 4 and 5 show fixed electrode 26c and fixed electrode 36c, respectively, which are voltage application electrodes, and the electrodes have the same constitution as that of the roll electrode 25c as described above. That is, the same dielectric layer as above is coated on a hollow stainless steel pipe, and the resulting electrode is constructed so as to be cooled with chilled water during discharge. Fourteen fixed electrodes are arranged along the circumference of the roll electrode described above.

Power sources for applying voltage to the voltage application electrode are not specifically limited. As the power sources, a high frequency power source (200 kHz) produced by Pearl Kogyo Co., Ltd., a high frequency power source (800 kHz) produced by Pearl Kogyo Co., Ltd., a high frequency power source (13.56 MHz) produced by Nippon Denshi Co., Ltd., and a high frequency power source (150 MHz) produced by Pearl Kogyo Co., Ltd. can be used.

FIG. 6 shows a schematic view of one embodiment of the plasma discharge apparatus used in the invention. In FIG. 6, plasma discharge vessel 36 has the same construction as that of FIG. 2, and in addition, a gas generating device 51, a power source 41, and an electrode cooling device 60 and so on are further provided. As a cooling agent used in the electrode cooling device 60, insulating materials such as distilled water and oil are used. Electrodes 25 and 36 shown in FIG. 6 are the same as those illustrated in FIGS. 3, 4, and 5. The gap distance between the opposed electrodes is, for example, approximately 1 mm.

The gap distance described above is determined considering thickness of a dielectric layer provided on the electrode base roll, applied voltage level, or an object of employing plasma. When one of the opposed electrodes described above has a dielectric layer or both opposed electrodes described above have a dielectric layer, the minimum gap distance between the electrode and the dielectric layer or between the both dielectric layers is preferably 0.5 to 20 mm, and more preferably 1±0.5 mm, in carrying out uniform discharge.

A mixed gas generated in the gas generating device 51 is introduced from supply port 52 in a controlled amount into a plasma discharge vessel 31, in which roll electrode 25 and fixed electrode 36 are arranged at a predetermined position, whereby the plasma discharge vessel is charged with the mixed gas, and thereafter, the gas is exhausted from the exhaust port 53. Subsequently, the roll electrode 25 being grounded, voltage is applied to electrodes 36 by power source 41 to generate discharge plasma. From stock roll 61 in which substrate F is wounded, substrate F is transported to a gap between the electrodes in the plasma discharge vessel 31 through guide roller 64 (so that the one side of the substrate contacts the surface of the roll electrode 25), subjected to discharge plasma treatment while transporting in the device to form a layer on the surface (CVD), and then transported to the next processing through guide roller 67. In the above, only the surface of the substrate opposite the surface contacting the roll electrode is subjected to discharge treatment.

The level of voltage applied to the fixed roll 36 by power source 41 is optionally determined. For example, the voltage is 10 V to 10 kV, and frequency of power source is adjusted to the range of from more than 100 kHz to 150 MHz. Herein, as a power supply method, either a continuous oscillation mode (called a continuous mode) with a continuous sine wave or a discontinuous oscillation mode (called a pulse mode) carrying ON/OFF discontinuously may be used, but the continuous mode is preferred in obtaining a uniform layer with high quality.

The vessel used in the plasma discharge vessel 31 is preferably a vessel of pyrex (R) glass, but a vessel of metal may be used if insulation from the electrodes is secured. For example, the vessel may be a vessel of aluminum or stainless steel laminated with a polyimide resin or a vessel of the metal which is thermally sprayed with ceramic to form an insulation layer on the surface.

When the substrate is made of resin, in order to minimize an influence on the substrate during the discharge plasma treatment, the substrate temperature during the plasma discharge treatment is adjusted to a temperature of preferably from ordinary temperature (15 to 25° C.) to less than 200° C., and more preferably from ordinary temperature to not more than 100° C. In order to adjust to the temperature within the range described above, the substrate or the electrodes are optionally cooled with a cooling means during the discharge plasma treatment.

In the invention, the discharge plasma treatment is carried out at atmospheric pressure or at approximately atmospheric pressure. Herein, approximately atmospheric pressure herein referred to implies a pressure of 20 kPa to 110 kPa. In order to obtain the effects as described in the invention, the pressure is preferably 93 kPa to 104 kPa.

In the electrodes for electric discharge used in the layer forming method of the invention, the maximum surface roughness Rmax of the surface of the electrode on the side contacting the substrate is adjusted to preferably not more than 10 μm in obtaining the effects as described in the invention, and adjusted to more preferably not more than 8 μm, and still more preferably not more than 7 μm. Herein, the maximum surface roughness is one defined in JIS B 0161. In order to obtain the above range of Rmax, the electrode surface is preferably subjected to polishing treatment. Further, the center-line average surface roughness (Ra) as defined in JIS B 0161 is preferably not more than 0.5 μm, and more preferably not more than 0.1 μm.

A mixed gas used in the layer forming method of the invention will be explained below.

A gas used when the layer forming method of the invention is carried out is basically a mixed gas of inert gas and a reactive gas for forming a layer, although it varies due to kinds of a layer formed on the substrate. The reactive gas content of the mixed gas is preferably 0.01 to 10% by volume. As the layer to be formed, a layer having a thickness of 1 nm to 1000 nm is formed.

The inert gas herein referred to implies an element belonging to group XVIII in the periodic table, and is typically helium, neon, argon, krypton, xenon, or radon. In order to obtain the effects of the invention, helium or argon is preferably used. In order to obtain a layer with high density and high precision, argon is most preferably used as inert gas. It is assumed that use of argon is likely to generate plasma with high density. The argon content of the mixed gas is preferably not less than 90% by volume, and more preferably not less than 95% by volume, based on the 100% by volume of mixed gas (a mixed gas of inert gas and reactive gas).

The reactive gas, which is a gas excited to plasma state at discharge space, contains a component for forming a layer, for example, an organometallic compound, an organic compound or an inorganic compound.

Employing, as the reactive gas, a gas containing for example, at least one organometallic compound selected from zinc acetyl acetonate, triethylindium, trimethylindium, diethylzinc, dimethylzinc, tetraethyltin, and tetraoctyltin, a metal oxide layer can be formed which is useful for a medium refractive index layer such as a conductive layer, an anti-static layer, or an anti-reflection layer. Employing, as the reactive gas, a fluorine-containing compound, a water repellent layer with a water repellent surface can be formed on a substrate, the surface of which contains a fluorine-containing group lowering the surface energy. Examples of the fluorine-containing compound include a carbon fluoride compound such as hexafluoropropylene ($CF_3CFCF_2$), or octafluorocyclobutane ($C_4F_8$). In view of safety, hexafluoropropylene or octafluorocyclobutane, which does not generate a harmful gas such as hydrogen fluoride, can be used.

The substrate is treated in an atmosphere of a monomer containing a hydrophilic group and a polymerizable unsaturated bond in the molecule, and a hydrophilic polymerization layer can be deposited on the substrate surface. Examples of the hydrophilic group include a hydroxyl group, a sulfonic acid group, a primary, secondary or tertiary amino group, an amido group, a quaternary ammonium group, a carboxylic acid group, and a carboxylic acid salt group. Use of a monomer containing a polyethylene glycol chain can also form a hydrophilic polymerization layer.

Examples of the monomer described above include acrylic acid, methacrylic acid, acryl amide, methacryl amide, N,N-dimethylacryl amide, sodium acrylate, sodium methacrylate, potassium acrylate, potassium methacrylate, styrene sulfonic acid sodium salt, allyl alcohol, allyl amine, polyethylene glycol dimethacrylate, and polyethylene glycol diacrylate, and at least one of these monomers can be used.

Further, use of a reactive gas containing an organic fluorine compound, a silicon compound or a titanium compound can form a low refractive index anti-reflection layer or a high refractive index layer. As the organic fluorine compound, a fluorocarbon gas or a fluorohydrocarbon gas is preferably used. Examples of the fluorocarbon gas include tetrafluorocarbon, hexafluorocarbon, for example, tetrafluoromethane, tetrafluoroethylene, hexafluoropropylene, and octafluorocyclobutane. Examples of the fluorohydrocarbon gas include difluoromethane, tetrafluoroethane, tetrafluoropropylene, and trifluoropropylene. Further, fluorohydrocarbon halide compounds such as monochlorotrifluoromethane, monochlorodifluoromethane or dichlorotetrafluorocyclobutane, or fluorinated organic compounds such as fluorinated alcohols, acids or ketones may be used, but the organic fluorine compound is not limited thereto. These compounds may have an ethylenically unsaturated group in the molecule. These compounds may be used singly or as a mixture of two or more kinds thereof.

When the above organic fluorine compound is used in the mixed gas, the content of the organic fluorine compound in the mixed gas is preferably 0.1 to 10% by volume, and more preferably 0.1 to 5% by volume, in that a uniform layer is formed on a substrate by discharge plasma treatment.

When the organic fluorine compound in the invention is gas at ordinary temperature and ordinary pressure, it can be used as it is in the mixed gas, wherein the method of the invention can be carried out most easily. When the organic fluorine compound in the invention is liquid or solid at ordinary temperature and ordinary pressure, it may be used as gas in which the compound is gasified by heating or under reduced pressure, or as a solution in which the compound is dissolved in an appropriate solvent.

When the above titanium compound is used in the mixed gas, the content of the titanium compound in the mixed gas is preferably 0.01 to 10% by volume, and more preferably 0.01 to 5% by volume, in that a uniform layer is formed on a substrate by the discharge plasma treatment.

As the reactive gas, a metal hydride compound, a metal halide compound, a metal hydroxide compound, or a metal peroxide compound can be used, and these may be optionally used in their gaseous state.

The mixed gas further containing hydrogen in an amount of 0.1 to 10% by volume can markedly increase hardness of a layer formed on a substrate.

The mixed gas further containing a component selected from oxygen, ozone, hydrogen peroxide, carbon dioxide, carbon monoxide, hydrogen and nitrogen in an amount of 0.01 to 5% by volume can accelerate reaction, and can form a layer with high density and high quality.

As the silicon compound or titanium compound described above, a metal hydride compound or a metal alkoxide compound is preferably used in view of handling, and the alkoxide compound is more preferably used, since it is not corrosive, and generates no harmful gas nor causes contamination.

When the silicon compound or titanium compound is introduced into a discharge space or a gap between the electrodes, both compounds may be in the form of gas, liquid, or solid at ordinary temperature and ordinary pressure. When they are gas at ordinary temperature and ordinary pressure, they can be introduced in the discharge space as they are. When they are liquid or solid, they are gasified by heating, or under reduced pressure or ultrasonic wave radiation, and used. When the silicon compound or the titanium compound is gasified and used, a metal alkoxide, which is liquid at ordinary temperature and has a boiling point of not more than 200° C., such as tetraethoxysilane or titanium tetraisopropoxide, is suitably used in order to form an anti-reflection layer. The above metal alkoxide may be diluted with another solvent. The solvents include an organic solvent such as methanol, ethanol, n-hexane or a mixture thereof. Since these solvents are decomposed during discharge plasma treatment, their influence on layer formation on the substrate or on composition of the formed layer during discharge plasma treatment can be neglected.

As the above described silicon compound, for example, an organometallic compound such as dimethylsilane or tetramethylsilane, a metallic hydride such as monosialne or disilane, a metal halide such as dichlorosilane or trichlorosilane, an alkoxysilane such as tetramethoxysilane, tetramethoxysilane or dimethyldiethoxysilane, or an organosilane is preferably used. The silicon compound used in the invention is not limited thereto. These compounds may be used singly or as a mixture of two or more kinds thereof.

When the above silicon compound is used in the mixed gas, the content of the silicon compound in the mixed gas is preferably 0.1 to 10% by volume, and more preferably 0.1 to 5% by volume, in that a uniform layer is formed on a substrate by the discharge plasma treatment.

As the above described titanium compound, for example, an organometallic compound such as tetradimethylamino titanium, a metal hydride compound such as titanium tetrahydride or dititanium hexahydride, a metal halide compound such as titanium dichloride, titanium trichloride or titanium tetrachloride, or a metal alkoxide compound such as titanium tetraethoxide, titanium tetrapropoxide or titanium tetrabutoxide is preferably used. The titanium compound used in the invention is not limited thereto.

When an organometallic compound is added to a reactive gas, the organometallic compound contains a metal selected from Li, Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Cd, In, Ir, Sn, Sb, Cs, Ba, La, Hf, Ta, W, Tl, Pb, Bi, Ce, Pr, Nd, Pm, Eu, Gd, Tb, Dy, Ho, Er, Tm, Yb, and Lu, and the organometallic compound is preferably one selected from a metal alkoxide, an alkylated metal, and a metal complex.

Various layers with high performance can be obtained properly selecting the above reactive gas or a reactive gas other than the above reactive gas and employing the layer forming method of the invention. One example thereof will be shown below, but the invention is not limited thereto.

Electrode membrane: Au, Al, Ag, Ti, Ti, Pt, Mo, Mo—Si
Dielectric protective membrane: $SiO_2$, SiO, $Si_3N_4$, $Al_2O_3$, $Al_2O_3$, $Y_2O_3$
Transparent conductive membrane: $In_2O_3$, $SiO_2$
Electrochromic membrane: $WO_3$, $IrO_2$, $MoO_3$, $V_2O_5$
Fluorescent membrane: ZnS, ZnS+ZnSe, ZnS+CdS
Magnetic recording membrane: Fe—Ni, Fe—Si—Al, $\gamma$-$Fe_2O_3$, Co, $Fe_3O_4$, Cr, $SiO_2$, $AlO_3$
Superconductive membrane: Nb, Nb—Ge, NbN
Solar battery membrane: a-Si, Si
Reflection membrane: Ag, Al, Au, Cu
Selective absorption membrane: ZrC—Zr
Selective transparent membrane: $In_2O_3$, $SnO_2$
Anti-reflection membrane: $SiO_2$, $TiO_2$, $SnO_2$
Shadow mask: Cr
Anti-abrasion membrane: Cr, Ta, Pt, TiC, TiN
Anti-corrosion membrane: Al, Zn, Cd, Ta, Ti, Cr
Heat resistant membrane: W, Ta, Ti
Lubricant membrane: $MoS_2$
Decoration membrane: Cr, Al, Ag, Au, TiC, Cu Next, the substrate used in the invention will be explained.

The substrate used in the invention may be in the form of film or in the form of stereoscopic body, for example, in the form of lens, as long as it can form a layer on its surface. When the substrate is one capable of being provided between electrodes, a layer can be formed by placing the substrate in plasma generated between the electrodes, and when the substrate is one incapable of being provided between the electrodes, a layer can be formed by spraying the generated plasma to the substrate.

Materials constituting the substrate are not specifically limited, but resins are preferred in that discharge is a low temperature glow discharge, and is carried out at atmospheric pressure or at approximately atmospheric pressure.

For example, when the layer regarding the invention is an anti-reflection layer, the substrate is preferably a film of cellulose ester such as cellulose triacetate, polyester, polycarbonate or polystyrene, or one in which a gelatin layer, a polyvinyl alcohol (PVA) layer, an acryl resin layer, a polyester resin layer or a cellulose resin layer is coated on the above described film. As the substrate, a substrate obtained by coating an anti-glare layer, a clear hard coat layer, a backing layer or an anti-static layer on a support can be used.

Examples of the support (also used as the substrate) include a polyester film such as a polyethylene terephthalate or polyethylene naphthalate film, a polyethylene film, a polypropylene film, a cellophane film, a film of a cellulose ester such as cellulose diacetate, cellulose acetate butyrate, cellulose acetate propionate, cellulose acetate phthalate, cellulose triacetate, cellulose nitrate or their derivative, a polyvinylidene chloride film, a polyvinyl alcohol film, an ethylene-vinyl alcohol film, a syndiotactic polystyrene film, a polycarbonate film, a norbornene resin film, a polymethylpentene film, a polyetherketone film, a polyimide film, a polyethersulfone film, a polysulfone film, a polyetherketoneimide film, a polyamide film, a fluorine-containing resin film, a nylon film, a polymethyl methacrylate film, an acryl film, and a polyarylate film.

These materials can be used singly or as a mixture of two or more kinds thereof. Commercially available materials such as Zeonecks (produced by Nippon Zeon Co., Ltd.) or ARTON (produced by Nippon Gosei Gomu Co., Ltd.) can be preferably used. Materials such as polycarbonate, polyacrylate, polysulfone and polyethersulfone, which have a high specific birefringence, can be also used by properly adjusting a solution casting condition, a melt extrusion condition, or a stretching condition in the transverse or mechanical direction. The substrate in the invention is not specifically limited to those described above. As the substrate in the invention, a film having a thickness of 10 to 1000 µm is preferably used.

When in the product or optical film of the invention the layer formed on the substrate is a layer for optical use such as an anti-reflection layer, a cellulose ester film is preferably used as the substrate in the invention, since it provides a low reflection laminate. As the cellulose ester, cellulose acetate, cellulose acetate butyrate, or cellulose acetate propionate is preferably used and cellulose acetate butyrate, or cellulose acetate propionate is more preferably used in effectively obtaining the effects of the invention.

When the above cellulose ester film is used as the substrate in the product or optical film of the invention, the cellulose ester film preferably contains a plasticizer.

The plasticizer used in the invention is not limited, but as the plasticizer, a phosphate plasticizer, a phthalate plasticizer, a trimellitate plasticizer, a pyromellitate plasticizer, a glycolate plasticizer, a citrate plasticizer, or a polyester plasticizer is preferably used. Examples of the phosphate plasticizer include triphenyl phosphate, tricresyl phosphate, cresyldiphenyl phosphate, octyldiphenyl phosphate, diphenylbiphenyl phosphate, trioctyl phosphate, and tributyl phosphate. Examples of the phthalate include diethyl phthalate, dimethoxyethyl phthalate, dimethyl phthalate, dioctyl phthalate, dibutyl phthalate, di-2-ethylhexyl phthalate, and butylbenzil phthalate. Examples of the trimellitate plasticizer include tributyl trimellitate, triphenyl trimellitate, and trimethyl trimellitate. Examples of the pyromellitate plasticizer include tetrabutyl pyromellitate, tetraphenyl pyromellitate, and tetraethyl pyromellitate. Examples of the glycolate plasticizer include triacetin, tributyrin, ethylphthalylethyl glycolate, methylphthalylethyl glycolate, and butylphthalylbutyl glycolate. Examples of the citrate plasticizer include triethyl citrate, tri-n-butyl citrate, acetyltriethyl citrate, acetyltri-n-butyl citrate, and acetyltri-n-(2-hexylethyl)citrate.

Examples of other carboxylic acid ester include butyl oleate, metylacetyl ricinolate, dibutyl sebacate, and various kinds of trimellitic acid esters.

Examples of the polyester plasticizer include copolymers of dibasic acids such as aliphatic dibasic acids, alicyclic dibasic acids, or aromatic dibasic acids with glycols. The aliphatic dibasic acids are not specifically limited, but examples of the aliphatic dibasic acids include adipic acid, sebacic acid, phthalic acid, terephthalic acid, and 1,4-cyclohexyldicarboxilic acid. Examples of the glycols include ethylene glycol, diethylene glycol, 1,3-propylene glycol, 1,2-propylene glycol, 1,4-butylene glycol, 1,3-butylene glycol, and 1,2-butylene glycol. These dibasic acids or glycols may be singly or as a mixture of two or more kinds thereof.

The plasticizer content of the cellulose ester film is preferably 1 to 20% by weight based on the weight of the cellulose ester, in view of film properties or processability.

When the layer formed on the substrate in the invention is an anti-reflection layer, it is preferred that the substrate (or support itself) contains a UV absorbent in minimizing deterioration of a liquid crystal.

The UV absorbent in the invention is preferably a UV absorbent which is excellent in absorption of ultraviolet light having a wavelength of 370 nm or less, and is less in absorption of visible light having a wavelength of 400 nm or more in clearly displaying a liquid crystal image. Examples of the UV absorbents preferably used in the invention include an oxybenzophenone compound, a benzotriazole compound, a salicylic acid ester compound, a benzophenone compound, a cyanoacrylate compound and a nickel complex compound, but are not limited thereto. The polymer UV absorbents described in Japanese Patent O.P.I. Publication No. 11-148430 are also preferably used.

The substrate in the invention preferably contains the UV absorbents as disclosed in Japanese Patent Application No. 11-295209, having a distribution coefficient of not less than 9.2, since it provides reduced contamination during discharge plasma treatment, and provides excellent coatability of various layers. The UV absorbent having a distribution coefficient of not less than 10.1 is especially preferably used.

When a cellulose ester film used as the substrate contains a UV absorbent or a plasticizer, these compounds may bleed out from the substrate during discharge plasma treatment, and result in problem such as contamination of a plasma discharge chamber due to their adherence to the chamber or their adherence to the substrate. In order to solve the above problem, a support comprising cellulose ester and a plasticizer is preferably used which has a weight change before and after storage at 80° C. and 90% RH falling within the range of ±2% by weight (retention property). As such a cellulose ester film, a cellulose ester film as disclosed in Japanese Patent Application No. 2000-338883 is preferably used. For the purpose of the above, a polymer UV absorbent (or a UV absorptive polymer) disclosed in Japanese Patent O.P.I. Publication No. 6-148430 or in Japanese Patent Application No. 2000-156039 can be preferably used. As a polymer UV absorbent, PUVA-30M (produced by Otsuka Kagaku Co., Ltd.) is commercially available. A polymer UV absorbent represented by formula (1) or (2) disclosed in Japanese Patent O.P.I. Publication No. 6-148430 or a polymer UV absorbent represented by formula (3), (6) or (7) in Japanese Patent Application No. 2000-156039 is especially preferably used.

When the layer formed on the substrate in the invention is an anti-reflection layer, a substrate having a retardation $R_0$ in planes of 0 to 1000 nm as the optical property is preferably used, and a substrate having a retardation $R_t$ in the thickness direction of 0 to 300 nm as the optical property is preferably used according to its usage. The wavelength dispersion property $R_0(600)/R_0(450)$ of the substrate is preferably from 0.7 to 1.3, and more preferably from 1.0 to 1.3.

Herein, $R_0(450)$ represents a retardation in planes based on the measurement of the three dimensional refractive index measured employing a 450 nm wavelength, and $R_0(600)$ represents a retardation in planes based on the measurement of the three dimensional refractive index measured employing a 600 nm wavelength.

When the layer formed on the substrate in the invention is an anti-reflection layer, the layer is preferably a layer formed by providing a polymerization layer on the substrate, polymerizing a composition comprising one or more kinds of ethylenically unsaturated monomers, and by subjecting the resulting polymerization layer to plasma discharge, in that adhesion between the layer formed by the plasma discharge treatment and the substrate is enhanced. Particularly when the layer, which has been formed by polymerizing a composition comprising one or more kinds of ethylenically unsaturated monomers, is treated with a solution having a pH of not less than 10, and then subjected to discharge plasma treatment, the adhesion is further enhanced. Herein, the solution having a pH of not less than 10 is preferably an aqueous 0.1 to 3 mol/liter sodium hydroxide or potassium hydroxide solution.

As a resin layer formed by polymerizing a composition containing an ethylenically unsaturated compound, a resin layer further containing an active ray hardenable resin or a heat-hardenable resin as the constitution component is preferably used, and the active ray hardenable resin layer is more preferably used.

The active ray hardenable resin layer herein referred to implies a layer containing, as a main component, a resin which is irradiated by active rays such as UV light or electronic beam to be hardened. Examples of the active ray hardenable resin include an ultraviolet (hereinafter referred to also as UV) ray hardenable resin or an electron beam hardenable resin. The active ray hardenable resin may be a resin which can be hardened by active rays other than UV ray or electron beam.

The UV ray hardenable resins include a UV ray hardenable acrylurethane resin, a UV ray hardenable polyesteracrylate resin, a UV ray hardenable epoxyacrylate resin, a UV ray hardenable polyolacrylate resin and a UV ray hardenable epoxy resin.

The UV ray hardenable acrylurethane resin can be easily obtained by reacting a polyesterpolyol with an isocyanate monomer or its prepolymer and then reacting the resulting product with an acrylate having a hydroxy group such as 2-hydroxyethylacrylate, 2-hydroxyethylmethacrylate (hereinafter, the acrylate comprises methacrylate) or 2-hydroxypropyl-acrylate (for example, Japanese Patent O.P.I. Publication No. 59-151110).

The UV ray hardenable polyesteracrylate resin can be easily obtained by reacting a polyesterpolyol with a monomer such as 2-hydroxyethylacrylate or 2-hydroxypropylacrylate (for example, Japanese Patent O.P.I. Publication No. 59-151112).

Examples of the UV ray hardenable epoxyacrylate resin include those obtained by reacting an epoxyacrylate oligomer in the presence of a reactive diluting agent and a photoinitiator (Japanese Patent O.P.I. Publication No. 1-105738). Examples of the photoinitiator include a benzoine derivative, an oxime ketone derivative, a benzophenone derivative or a thioxanthone derivative. These initiators may be used singly or as a mixture of two or more kinds thereof.

Examples of the UV ray hardenable polyolacrylate resin include trimethylolpropane triacrylate, ditrimethylolpropane tetracrylate, pentaerythritol tetracrylate, dipentaerythritol pentacrylate, dipentaerythritol hexacrylate or alkyl-modified dipentaerythritol pentacrylate.

These resins are usually used with a conventional photo-initiator. The above photoinitiator also works as a photo-sensitizer. Examples thereof include acetophenones, benzophenones, hydroxy benzophenones, Michler's ketone, α-amyloxime esters, and thioxanthones or their derivatives. The photo-sensitizers such as n-butylamine, triethylahiine and tri-n-butylphosphine can be used together with the photo-toinitiator in the reaction of epoxyacrylates. The content of the photo-initiator or photo-sensitizer used in the ultraviolet ray hardenable resin coating composition, after the volatile solvent in the composition is removed by coating and then drying, is preferably 2.5 to 6% by weight.

The polymerizable monomers having one unsaturated double bond in the molecule include methyl acrylate, ethyl acrylate, butyl acrylate, vinyl acetate, benzyl acrylate, cyclohexyl acrylate, and styrene. The polymerizable monomers having two unsaturated double bonds in the molecule include ethylene glycol diacrylate, propylene glycol diacrylate, divinylbenzene, 1,4-cyclohexane diacrylate, 1,4-cyclohexyldimethyl diacrylate, trimethylol propane triacrylate, and pentaerythritol tetraacrylate.

The ultraviolet ray hardenable resins are selected from ADEKA OPTOMER KR·BY series: KR-400, KR-410, KR-550, KR-566, KR-567, or BY-320B (each produced by Asahi Denka Co., Ltd.); Koei Hard A-101-KK, A-101-WS, C-302, C-401-N, C-501, M-101, M-102, T-102, D-102, NS-101, FT-102Q8, MAG-1-P20, AG-106, or M-101-C, (each produced by Koei Kagaku Co., Ltd.); SEIKA BEAM PHC 2210 (S), PHC X-9 (K-3), PHC 2213, DP-10, DP-20, DP-30, P1000, P1100, P1200, P1300, P1400, P1500, P1600, or SCR 900 (each produced by Dainichi Seika Kogyo Co., Ltd.); KRM7033, KRM7039, KRM7130, KRM7131, UVCRYL29201, or UVCRYL29202 (each produced by Daicel·UCB Co., Ltd.); RC-5015, RC-5016, RC-5020, RC-5031, RC-5100, RC-5102, RC-5120, RC-5122, RC-5152, RC-5171, RC-5180, or RC-5181 (each produced by Dainippon Ink and Chemicals,-Inc.); AUREX No. 340 Clear (produced by Chugoku Toryo Co., Ltd.);. SANRAD H-601 (produced by Sanyo Chemical Industries, Ltd.); SP-1509 or SP-1507 (each produced by Showa Kobunshi Co., Ltd.); RCC-15C (produced by Grace Japan Co., Ltd.); and ARONIX M-6100, M-8030, or M-8060 (produced by Toa Gosei Co., Ltd.); and other resins which are available on the market.

The active ray hardened layer used in the invention can be provided according to a conventional method. As a light source for hardening an active ray hardenable layer due to photo-hardening reaction to form a hardened layer, any light source capable of emitting UV rays can be used. Examples of the light source include a low pressure mercury lamp, a medium pressure mercury lamp, a high pressure mercury lamp, a super-high pressure mercury lamp, a carbon arc lamp, a metal halide lamp, and a xenon lamp.

Although the exposure amount is varied depending on the kinds of light source, it may be 20-10,000 mJ/cm$^2$, and is preferably 50-2,000 mJ/cm$^2$. The sensitizer having an absorption maximum in the range of from near-ultraviolet to visible wavelength is used.

The solvents for preparing the coating solution of the active ray hardenable resin layer can be suitably selected from the solvents used in the above backing layer or conductive fine particle-containing layer, for example, hydrocarbons, alcohols, ketones, esters, glycols, other solvents or a mixture thereof. It is preferred that the solvent is a solvent containing, in an amount of preferably not more than 5% by weight and more preferably 5 to 80% by weight, propylene glycol monoalkyl (alkyl having 1 to 4 carbon atoms) ether or propylene glycol monoalkyl (alkyl having 1 to 4 carbon atoms) ether ester.

The coating solution of the ultraviolet ray hardenable resin composition is coated through a gravure coater, a spinner coater, a wire bar coater, a roll coater, a reverse-roll coater, an extrusion coater or an air-doctor coater, and the wet coating thickness is preferably 0.1 to 30 μm, and more preferably 0.5 to 15 μm. The coating speed is preferably 10 to 60 m/minute.

The coated layer after dried is irradiated with ultraviolet rays for preferably 0.5 seconds to 5 minutes, and more preferably 3 seconds to 2 minutes, in view of hardening efficiency of the ultraviolet ray hardenable resin or workability.

The hardened layer preferably contains inorganic or organic fine particles in order to prevent blocking or to increase abrasion resistance. The inorganic fine particles include silicon oxide, titanium oxide, aluminum oxide, tin oxide, zinc oxide, calcium carbonate, barium sulfate, talc, kaolin and calcium sulfate. The organic fine particles include polymethacrylic acid-methylacrylate resin particles, acryl-styrene resin particles, polymethylmethacrylate resin particles, silicon resin particles, polystyrene resin particles, polycarbonate resin particles, benzoguanamine resin particles, melamine resin particles, polyolefin resin particles, polyester resin particles, polyamide resin particles, polyimide resin particles and polyethylene fluoride resin particles. These particles can be added to the ultraviolet ray hardenable resin composition. These particles have an average particle size of preferably 0.005 to 1 μm, and more preferably 0.01 to 0.1 μm.

The content of the particles is preferably 0.1 to 10 parts by weight based on the 100 parts by weight of the ultraviolet ray hardenable resin composition.

The hardened layer formed by hardening a UV hardenable resin layer may be a clear hard coat layer with a center-line surface roughness Ra of 1 to 50 nm, or an anti-glare layer with an Ra of 0.1 to 1 μm. In the invention, these layers can be subjected to plasma treatment. According to the method of the invention, a uniform optical interference layer such as a high refractive index layer or a low refractive index layer can be provided on the uneven surface of the substrate. It is preferred that uniform plasma treatment is carried out on an anti-glare layer with a center-line average surface roughness Ra defined in JIS B 0601 of 0.1 to 0.5 μm to form a layer.

When the layer in the invention is formed on the substrate as described above, the thickness deviation from the average thickness of the layer falls within the range of preferably ±10%, more preferably ±5%, and still more preferably ±1%.

When a product or optical film having an anti-reflection layer on a substrate is prepared in the invention, the surface of the substrate before subjected to plasma treatment is preferably irradiated with UV rays, whereby adhesion of the layer to the substrate surface is enhanced. The UV ray irradiation amount after plasma treatment is preferably 50 to 2000 mJ/cm$^2$. The UV ray irradiation amount less than 50 mJ/cm$^2$ may not provide good results, and the UV ray irradiation amount exceeding 2000 mJ/cm$^2$ may result in deformation of the substrate. Plasma treatment is carried out in preferably one hour and more preferably in ten minutes after the UV ray irradiation. The UV ray irradiation before the plasma treatment may be carried out at the same time as the UV ray irradiation for hardening the UV ray hardenable resin as described above. In this case, the UV ray irradiation is preferably carried out in an irradiation amount more than a minimum irradiation amount required for the hardening.

When in the invention an anti-reflection layer is prepared, it is effective that the layer is subjected to plasma treatment and then to UV ray irradiation, since the layer is quickly stabilized.

For this purpose, the layer surface subjected to plasma treatment is preferably irradiated with UV ray in an irradiation amount of 50 to 2000 mJ/cm$^2$. This irradiation is preferably carried out after plasma treatment and before the irradiated substrate is wound around a core. The substrate subjected to the plasma treatment is preferably treated for 1 to 30 minutes in a drying zone maintained at 50 to 130° C.

Both surfaces of a product or optical film having an anti-reflection layer on the substrate in the invention are preferably subjected to plasma treatment, since curl is reduced. Each surface of the substrate may be subjected to plasma treatment, separately, but it is preferred that both surfaces of the substrate are simultaneously subjected to plasma treatment. The surface of the substrate opposite the low reflection layer is preferably subjected to backing treatment due to plasma treatment. As the backing treatment, there is, for example, an adhesion enhancing treatment as disclosed in Japanese Patent Application No. 2000-273066, or an anti-static treatment as disclosed in Japanese Patent Application No. 2000-80043. The backing treatment is not limited to these treatments.

In the invention, the product or optical film having on the substrate a metal oxide layer, which works as, for example, an anti-reflection layer, preferably comprises a high refractive index layer with a refractive index of 1.6 to 2.4 containing titanium oxide as a main component. It is preferred that in addition to the above high refractive index layer, a low refractive index layer with a refractive index of 1.3 to 1.5 containing silicon oxide as a main component is continuously provided on the substrate, which provides good adhesion between the layers. It is more preferred that immediately after an ultraviolet hardened layer is provided on a substrate, the layer is subjected to plasma treatment to form a high refractive index layer and a low refractive index layer on the substrate.

The refractive index of the above high refractive index layer containing titanium oxide as a main component is especially preferably not lass than 2.2. Such a high refractive index metal oxide layer can be formed according to the layer forming method of the invention.

The metal oxide layer such as a layer containing titanium oxide as a main component has a carbon content of preferably from 0.1 to 5% by weight, in view of its flexibility or its adhesion to a lower layer. The carbon content of the metal oxide layer is more preferably 0.2 to 5% by weight, and still more preferably 0.3 to 3% by weight. This carbon content range also applies to that of the low refractive index layer containing silicon oxide as a main component as described above.

The above carbon content range in the above metal oxide layer such as the anti-reflection layer similarly applies to another layer such as a layer of a metal, another metal oxide, a metal nitride or a metal boride. When a substrate is subjected to plasma treatment employing a reactive gas containing an organic compound, a layer containing a carbon atom is formed on the substrate, and therefore, the plasma treatment easily provides a layer having a carbon content of the above range. The above carbon content range is preferable in not only the layer formed by plasma treatment but also in another layer, since the range provides improved flexibility or adhesion. However, too low a carbon content tends to produce cracks in the formed layer, and too high a carbon content tends to change a refractive index with time and lower abrasion resistance, which is undesirable.

EXAMPLES

The invention will be detailed according to the following examples, but is not limited thereto.

(Preparation of Dielectric Coated Eelectrode Set A of the Invention)

In the plasma discharge apparatus of FIG. 2, a set of a dielectric coated roll electrode and plural dielectric coated prismatic electrodes was prepared as follows:

In a roll electrode 25 of FIG. 2, a stainless steel jacket roll base material having a cooling device (not illustrated in FIG. 2) employing chilled water was coated with an alumina thermal spray layer with high density and high adhesion according to an atmospheric plasma method to obtain a roll electrode with a roll diameter of 1000 mm. After that, a solution prepared by diluting tetramethoxysilane with ethyl acetate was coated on the resulting electrode, dried and hardened by UV ray irradiation to carry out sealing treatment. Thus, a roll electrode having a dielectric layer was obtained. The dielectric layer surface of the roll electrode was polished, smoothed, and processed to give an Rmax of 5 μm.

The thus obtained dielectric layer had a void volume of 5% by volume. The dielectric layer had an SiOx content of 75 mol %. The thickness of the dielectric layer was 1 mm (the layer thickness variation falling within the range of ±1%). The relative dielectric constant of the dielectric was 10. The difference in linear thermal expansion coefficient between the conductive base material and the dielectric was $9.8 \times 10^{-6}/°C$.

The resulting roll electrode 25 was grounded.

The same dielectric layer as above was coated on hollow, prismatic pure titanium pipes under the same condition as above. Thus, a group of counter electrodes opposed to the roll electrode was prepared as a group of voltage application electrodes. The dielectric layer of the voltage application electrodes had the same physical properties as that of the above roll electrode, but in the voltage application electrodes the difference in linear thermal expansion coefficient between the conductive base material and the dielectric was $1.7 \times 10^{-6}/°C$. The total discharge surface area of the voltage application electrodes was 15000 cm² {=150 cm (length in the transverse direction)×2 cm (length in the transport direction)×50 (the number of counter electrodes)}

The thus obtained electrode set having the opposed electrodes had a heat resistance of 200° C., a voltage endurance of not less than 10 kV, and a maximum output of not less than 400 kW/m². Even when continuous discharge was carried out for 240 hours, no damage was observed in the electrode set.

(Preparation of Dielectric Coated Electrode Set B of the Invention)

A dielectric coated electrode set B was prepared in the same manner as in dielectric coated electrode set A above, except that a stainless steel pipe was used instead of the hollow, prismatic pure titanium pipe used for preparation of the voltage application electrode. This electrode set B had the same Rmax, SiO₂ content, dielectric layer thickness, and relative dielectric constant as those of electrode set A, but in the voltage application electrode the difference in linear thermal expansion coefficient between the conductive base material and the dielectric was $9.8 \times 10^{-6}/°C$.

The thus obtained electrode set B having the opposed electrodes had a heat resistance of 120° C., a voltage endurance of not less than 10 kV, and a maximum output of not less than 400 kW/m². Even when continuous discharge was carried out for 240 hours, no damage was observed in the electrode set.

(Preparation of Dielectric Coated Electrode Set C of the Invention)

In a roll electrode 25 of FIG. 2, a stainless steel jacket roll base material having a cooling device (not illustrated in FIG. 2) employing chilled water was coated with two dielectric layers each having a different void volume according to a glass lining method to obtain a roll electrode with a roll diameter of 200 mm. The lower dielectric layer had a thickness of 0.3 mm and a void volume of 25% by volume. The upper dielectric layer had a thickness of 0.7 mm and a void volume of 3% by volume. Further, the dielectric layer surface of the roll electrode was polished, smoothed, and processed to give an Rmax of 5 μm.

The thus obtained dielectric layer had a void (having an opening on the layer surface) volume of 0% by volume. The final thickness of the dielectric layer was 1 mm (the layer thickness variation falling within the range of ±1%). The relative dielectric constant of the dielectric was 6.1. The difference in linear thermal expansion coefficient between the conductive base material and the dielectric was $5.3 \times 10^{-6}/°C$.

The resulting roll electrode 25 was grounded.

The same dielectric layer as above was coated on a hollow, prismatic stainless steel pipe employing the same glass lining method as above. Thus, a group of counter electrodes opposed to the roll electrode was prepared as a group of voltage application electrodes. The total discharge surface area of the voltage application electrodes was 15000 cm² {=150 cm (length in the transverse direction)×2 cm (length in the transport direction)×50 (the number of voltage application electrodes)}

The thus obtained electrode set having the opposed electrodes had a heat resistance of 100° C., a voltage endurance of not less than 10 kV, and a maximum output of not less than 200 kW/m². Even when continuous discharge was carried out for 240 hours, no damage was observed in the electrode set.

(Preparation of Comparative Dielectric Coated Electrode Set)

Comparative dielectric coated electrode set was prepared in the same manner as in dielectric coated electrode set, except that the alumina thermal spray layer coating method was carried out employing a flame spray method instead of the atmospheric plasma method.

The thus obtained dielectric layer had a void volume of 11% by volume. The thus obtained electrode set having the opposed electrodes had a heat resistance of 80° C., a voltage endurance of 2 kV. The maximum output of this electrode set was 8 kW/m² (0.8 kW/cm²), and could not attain intended output.

(Preparation of Substrate)

A cellulose ester film as a substrate was prepared according to the following procedure:

<<Preparation of Dope C>>

| (Preparation of Silicon oxide dispersion liquid A) | |
|---|---|
| Aerosil 2000V (produced by Nihon Aerosil Co., Ltd.) | 1 kg |
| Ethanol | 9 kg |

The above composition was mixed with stirring in a dissolver for 30 minutes, and dispersed in a mantongorin type high pressure disperser to obtain Silicon oxide dispersion liquid A.

| (Preparation of Solution B) | |
|---|---|
| Cellulose triacetate (acetyl substitution degree: 2.65) | 6 kg |
| Methylene chloride | 140 kg |

The above composition was incorporated in a sealed vessel, heated with stirring, and filtered to obtain a solution. The resulting solution was added with stirring to 10 kg of the above-obtained Silicon oxide dispersion liquid A, stirred for additional three hours, and filtered to obtain Solution B.

| (Preparation of Base dope C) | |
|---|---|
| Methylene chloride | 440 kg |
| Ethanol | 35 kg |
| Cellulose triacetate (acetyl substitution degree: 2.65) | 100 kg |
| Triphenyl phosphate | 8 kg |
| Ethylphthalylethylglycolate | 3 kg |
| TINUVIN 326 (produced by Ciba Speciality Chemicals Co. Ltd.) | 0.4 kg |
| TINUVIN 109 (produced by Ciba Speciality Chemicals Co. Ltd.) | 0.9 kg |
| TINUVIN 171 (produced by Ciba Speciality Chemicals Co. Ltd.) | 0.9 kg |

The above dope composition was incorporated in a sealed vessel, and stirred while heating to obtain a solution. The resulting solution was cooled to a temperature to be cast on a support, allowed to stand overnight, defoamed, and filtered employing an Azumi Roshi No. 244 produced by Azumi Roshi Co., Ltd. to obtain Base dope C. Subsequently, Solution B was added to the Base dope C-at an addition rate of 2 kg per 100 kg of the Base dope C, uniformly mixed in an in-line mixer (a static in-line mixer Hi-Mixer SWJ, produced by Toray Co. Ltd.), and filtered to obtain Dope C.

<<Preparation of Dope E>>

| (Preparation of Silicon oxide dispersion liquid A) | |
|---|---|
| Aerosil R972V (average primary particle size: 16 nm, produced by Nihon Aerosil Co., Ltd.) | 1 kg |
| Ethanol | 9 kg |

The above composition was mixed with stirring in a dissolver for 30 minutes, and dispersed in a mantongorin type high pressure disperser to obtain Silicon oxide dispersion liquid A.

| (Preparation of Solution D) | |
|---|---|
| Cellulose acetate propionate (acetyl substitution degree: 2.0, propionyl substitution degree: 0.8) | 6 kg |
| Methyl acetate | 100 kg |
| Ethanol | 40 kg |

The above composition was incorporated in a sealed vessel, heated with stirring, and filtered to obtain a solution. The resulting solution was added with stirring to 10 kg of the above-obtained Silicon oxide dispersion liquid A, stirred for additional three hours, and filtered to obtain Solution D.

| (Preparation of Base dope E) | |
|---|---|
| Cellulose acetate propionate (acetyl substitution degree: 2.0, propionyl substitution degree: 0.8) | 100 kg |

| (Preparation of Base dope E) | |
|---|---|
| Methyl acetate | 290 kg |
| Ethanol | 85 kg |
| KE-604 (produced by Arakawa Kagaku Kogyo Co., Ltd.) | 15 kg |
| PUVA-30M (produced by Otsuka Kagaku Co., Ltd.) | 5 kg |

The above dope composition was incorporated in a sealed vessel, and stirred while heating to obtain a solution. The resulting solution was cooled to a temperature to be cast on a support, allowed to stand overnight, defoamed, and filtered employing an Azumi Roshi No. 244 produced by Azumi Roshi Co., Ltd. to obtain a Base dope E. Subsequently, Solution D was added to the Base dope E at an addition rate of 2 kg per 100 kg of the Base dope E, uniformly mixed in an in-line mixer (a static in-line mixer Hi-Mixer SWJ, produced by Toray Co. Ltd.), and filtered to obtain a Dope E.

<<Preparation of Dope G>>

| (Preparation of Silicon oxide dispersion liquid F) | |
|---|---|
| Aerosil 200V (produced by Nihon Aerosil Co., Ltd.) | 1 kg |
| Ethanol | 9 kg |

The above composition was mixed with stirring in a dissolver for 30 minutes, and dispersed in a mantongorin type high pressure disperser to obtain Silicon oxide dispersion liquid F.

| (Preparation of Solution E) | |
|---|---|
| Cellulose triacetate (acetylsubstitution degree: 2.88) | 6 kg |
| Methylene chloride | 140 kg |

The above composition was incorporated in a sealed vessel, heated with stirring, and filtered to obtain a solution. The resulting solution was added with stirring to 10 kg of the above-obtained Silicon oxide dispersion liquid F, stirred for additional three hours, and filtered to obtain Solution E.

| (Preparation of Base dope G) | |
|---|---|
| Methylene chloride | 440 kg |
| Ethanol | 35 kg |
| Cellulose triacetate (acetyl substitution degree: 2.88) | 100 kg |
| Triphenyl phosphate | 9 kg |
| Ethylphthalylethylglycolate | 4 kg |
| TINUVIN 326 (produced by Ciba Speciality Chemicals Co. Ltd.) | 0.4 kg |
| TINUVIN 109 (produced by Ciba Speciality Chemicals Co. Ltd.) | 0.9 kg |
| TINUVIN 171 (produced by Ciba Speciality Chemicals Co. Ltd.) | 0.9 kg |

The above dope composition was incorporated in a sealed vessel, and stirred while heating to obtain a solution. The resulting solution-was cooled to a temperature to be cast on a support, allowed to stand overnight, defoamed, and filtered employing an Azumi Roshi No. 244 produced by Azumi Roshi Co., Ltd. to obtain a Base dope G. Subsequently, Solution E was added to the Base dope G at an addition rate of 2 kg per 100 kg of the Base dope G, uniformly mixed in an in-line mixer (a static in-line mixer Hi-Mixer SWJ, produced by Toray Co. Ltd.), and-filtered to obtain a Dope G.

The acyl substitution degree of the cellulose ester used in the above dopes C, E and G was measured according to a method described below.

<<Measurement of the Acyl Substitution Degree of the Cellulose Ester>>

The substitution degree was measured according to a method as described in ASTM-D817-96.

<<Preparation of Cellulose Ester Film>>

Cellulose ester films 1 through 3 were prepared employing the above dopes C, E and G, according to the following procedures.

(Preparation of Cellulose Ester Film 1)

Dope C was filtered, and was uniformly cast at a dope temperature of 35° C. on a 30° C. stainless steel belt support to form a web, employing a belt casting apparatus. The web was dried until it could be peeled from the support, and then was peeled from the support. At peeling, the residual solvent amount of the web was 35%.

The peeled web was dried at 115° C. while holding both side edges of the web film, released from the holding, further dried in a dry zone of 120° C. while transported by rollers, and subjected to knurling treatment to give a protrusion a 5 μm height and a 10 mm width at the both side edges. Thus, cellulose ester film 1 with a thickness of 80 μm was prepared. The film width was 1300 mm, and the film winding length was 1500 m.

(Preparation of Cellulose Ester Films 2 and 3)

Cellulose ester film 2 with a thickness of 80 μm was prepared in the same manner as in cellulose ester film 1, except that Dope E was used instead of Dope C. Cellulose ester film 3 with a thickness of 80 μm was prepared in the same manner as in Cellulose ester film 2, except that Dope G was used instead of Dope E.

The cellulose ester films 1, 2, and 3 were measured for retention property according to the method as described later. The retention property of films 1, 2, and 3, which was determined from the weight variation before and after the films were stored at 80° C. and at 90% RH for 48 hours, was 5.1%, 0.4%, and 5.0%, respectively.

<<Evaluation of Retention Property>>

Each of the films was cut to a size of 10 cm×10 cm, allowed to stand at 23° C. and at 55% RH for 24 hours, and weighed. Then, the film was subjected to heat treatment in which the film was stored at 80° C. and at 90% RH for 48 hours, and then the surface of the film was softly wiped. Thereafter, the resulting film was again allowed to stand at 23° C. and at 55% RH for 24 hours, and then weighed. The retention property is represented by the following formula:

Retention property (%)={Film weight before heat treatment−Film weight after heat treatment}×100/Film weight before heat treatment <<Preparation of Film Substrate>>

Film substrates were prepared employing cellulose ester films 1, 2, and 3, as follows:

(Preparation of Film Substrate 1)

Cellulose ester film 1 itself was designated as film substrate 1.

(Preparation of Film Substrate 2)

The following coating composition (2) was extrusion coated on one surface b of cellulose ester film 1 to give a wet thickness of 13 μm, dried in a drying zone of 80° C., and subjected to ultraviolet light irradiation at 120 mJ/cm² to obtain a clear hard coat layer with a dry thickness of 4 μm and a center line average surface roughness ($R_a$) of 15 nm. The surface b herein referred to means the surface of the web contacting the belt support in the dope casting film manufacture.

(Preparation of Film Substrate 3)

The following coating composition (3) was extrusion coated on one surface b of cellulose ester film 1 to give a wet thickness of 13 μm, dried in a drying zone of 80° C., and subjected to ultraviolet light irradiation at 120 mJ/cm² to obtain an antiglare layer with a dry thickness of 5 μm and a center line average surface roughness ($R_a$) of 0.3 μm. The surface b herein referred to means the surface of the web film facing the belt support at the dope casting.

(Preparation of Film Substrates 4 Through 6)

Film substrates 4 through 6 were prepared in the same manner as in Film substrates 1 through 3, respectively, except that cellulose ester film 2 was used instead of cellulose ester film 1.

(Preparation of Film Substrates 7 Through 9)

Film substrates 7 through 9 were prepared in the same manner as in Film substrates 1 through 3, respectively, except that cellulose ester film 3 was used instead of cellulose ester film 1. Herein was used a cellulose ester film 3 having a back coating layer on the other surface a of the film (opposite the surface b). That is, before the clear hard coat layer or antiglare layer was coated, the following coating composition (1) had been extrusion coated on the other surface a of cellulose ester film 3 to give a wet thickness of 13 μm, dried at 80° C. to obtain a back coating layer.

The coating compositions (1) and (2) used in the preparation of the above film substrates and the preparation method of coating composition (3) are shown below.

| Coating composition (1) (Back coating layer coating composition) | |
|---|---|
| Acetone | 30 parts by weight |
| Ethyl acetate | 45 parts by weight |
| Isopropyl alcohol | 10 parts by weight |
| Diacetyl cellulose | 0.5 parts by weight |
| 2% silica fine particle acetone dispersion liquid (Aerosil 200V, produced by Nihon Aerosil Co., Ltd.) | 0.1 parts by weight |

| Coating composition (2) (Clear hard coat (CHC) layer coating composition) | |
|---|---|
| Dipentaerythritol hexacrylate monomer | 60 parts by weight |
| Dipentaerythritol hexacrylate dimmer | 20 parts by weight |
| Dipentaerythritol hexacrylate trimer or polymer higher than the trimer | 20 parts by weight |
| Dimethoxybenzophenone (photo-initiator) | 4 parts by weight |
| Ethyl acetate | 50 parts by weight |
| Methyl ethyl ketone | 50 parts by weight |
| Isopropyl alcohol | 50 parts by weight |

| Preparation of Coating composition (3) (Anti-glare coating layer coating composition) | |
| --- | --- |
| Ethyl acetate | 50 parts by weight |
| Methyl ethyl ketone | 50 parts by weight |
| Isopropyl alcohol | 50 parts by weight |
| Silycia 431 (average particle size: 2.5 μm, produced by Fuji Silysia Chemical Co., Ltd.) | 2.5 parts by weight |
| Aerosil R972V (average particle size: 16 nm, produced by Nihon Aerosil Co., Ltd.) | 2 parts by weight |

The above composition was stirred in a high speed stirrer TK Homomixer (produced by Tokushu Kika Kogyo Co., Ltd.), further dispersed in a collision type disperser Manton-gorin (produced by Gorin Co., Ltd.), and then added with the following components to obtain a coating composition (3).

| | |
| --- | --- |
| Dipentaerythritol hexacrylate monomer | 60 parts by weight |
| Dipentaerythritol hexacrylate dimmer | 20 parts by weight |
| Dipentaerythritol hexacrylate trimer or polymer higher than the trimer | 20 parts by weight |
| Dimethoxybenzophenone (photo-initiator) | 4 parts by weight |

The above obtained film substrates 1 through 9 are shown in Table 1.

TABLE 1

| Film substrate | Support | Coating layer on surface "a" | Coating layer on surface "b" |
| --- | --- | --- | --- |
| Film substrate 1 | Cellulose ester film 1 | None | None |
| Film substrate 2 | Cellulose ester film 1 | None | Clear hard coat layer |
| Film substrate 3 | Cellulose ester film 1 | None | Anti-glare layer |
| Film substrate 4 | Cellulose ester film 2 | None | None |
| Film substrate 5 | Cellulose ester film 2 | None | Clear hard coat layer |
| Film substrate 6 | Cellulose ester film 2 | None | Anti-glare layer |
| Film substrate 7 | Cellulose ester film 3 | Back coating layer | None |
| Film substrate 8 | Cellulose ester film 3 | Back coating layer | Clear hard coat layer |
| Film substrate 9 | Cellulose ester film 3 | Back coating layer | Anti-glare layer |

Example 1

<<Preparation of Optical Film>>

Optical films 8A through 8O having the anti-reflection layers as shown in Table 2 were prepared employing film substrate 8 as shown in Table 1 and employing a plasma discharge apparatus as shown in FIG. 6 equipped with the plasma discharge vessel as shown in FIG. 2 in which the dielectric coated electrode set B of the invention as prepared above is installed.

As the power sources for plasma generation, a high frequency power source (50 kHz) produced by Shinko Denki Co. Ltd, an impulse high frequency power source (100 kHz, used with continuous mode) produced by Heiden Kenkyuusho, a high frequency power source (200 kHz) produced by Pearl Kogyo Co., Ltd., a high frequency power source (800 kHz) produced by Pearl Kogyo Co., Ltd., a high frequency power source (13.56 MHz) produced by Nippon Denshi Co., Ltd., and a high frequency power source (150 MHz) produced by Pearl Kogyo Co., Ltd. were used.

<<Discharge Condition>>

Discharge output was varied between 0.1 to 100 W/cm$^2$.

<<Reactive Gas>>

The composition of a mixed gas (reaction gas) used in the plasma treatment will be shown below.

| (Composition for forming a titanium oxide layer) | |
| --- | --- |
| Inert gas: argon | 98.75% by volume |
| Reactive gas 1: a hydrogen gas (1% based on the total mixed gas) | |
| Reactive gas 2: tetraisopropoxytitanium vapor (liquid heated to 150° C. was bubbled with argon gas) based on the total reaction gas. | 0.25% by volume |

The hard coat layer of film substrate 8 was continuously subjected to atmospheric pressure plasma treatment under the above discharge condition employing the above reactive gas to obtain a 100 nm layer on the hard coat layer. The refractive index of the resulting layer was measured.

<<Measurement of Refractive Index and Layer Thickness>>

The spectral reflectance of the resulting layer was measured under condition of a 5° regular reflection through a spectrophotometer TYPE 1U-4000 (produced by Hitachi Seisakusho Co., Ltd.). In order to prevent light reflection from the rear surface of the optical film opposite the observer side, the rear surface was surface-roughened, and subjected to light absorbing treatment employing with black spray to form a light absorbing layer. Reflectance of the resulting film was measured employing a wavelength of from 400 nm through 700 nm. An optical thickness was calculated from $\lambda/4$ of the spectra, and then refractive index was calculated based on the aforementioned. Further, the layer thickness was calculated from the results of the reflection spectra. Herein a refractive index measured employing a 550 nm light was adopted as a representative value.

TABLE 2

| | Power source frequency (sine wave) | Discharge output | Refractive index | Remarks |
| --- | --- | --- | --- | --- |
| Optical film 8A | 200 kHz | 1.2 W/cm$^2$ | 2.2 | Invention |
| Optical film 8B | 200 kHz | 25 W/cm$^2$ | 2.32 | Invention |
| Optical film 8C | 800 kHz | 1.2 W/cm$^2$ | 2.25 | Invention |
| Optical film 8D | 800 kHz | 25 W/cm$^2$ | 2.34 | Invention |
| Optical film 8E | 13.56 MHz | 1.2 W/cm$^2$ | 2.28 | Invention |
| Optical film 8F | 13.56 MHz | 25 W/cm$^2$ | 2.34 | Invention |
| Optical film 8G | 150 MHz | 1.2 W/cm$^2$ | 2.22 | Invention |
| Optical film 8H | 150 MHz | 25 W/cm$^2$ | 2.31 | Invention |
| Optical film 8I | 50 kHz | 1.2 W/cm$^2$ | 1.75 | Comparative |

TABLE 2-continued

| | Power source frequency (sine wave) | Discharge output | Refractive index | Remarks |
|---|---|---|---|---|
| Optical film 8J | 50 kHz | 25 W/cm² | 1.8 | Comparative |
| Optical film 8K | 100 kHz | 0.8 W/cm² | 1.81 | Comparative |
| Optical film 8L | 100 kHz | 1.2 W/cm² | 1.85 | Comparative |
| Optical film 8M | 200 kHz | 0.8 W/cm² | 1.88 | Comparative |
| Optical film 8N | 13.56 MHz | 0.8 W/cm² | 1.9 | Comparative |
| Optical film 8O | 150 MHz | 0.8 W/cm² | 1.9 | Comparative |

As is apparent from Table 2, each of the inventive optical films 8A through 8H provides improved refractive index and a layer with high quality.

Example 2

<<Preparation of Optical Film>>

Optical films 22 through 32 were prepared employing film substrates 1 through 9 and employing the same plasma discharge apparatus as Example 1. The preparation was carried out as follows.

In the preparation of optical films 22 through 30, a roll electrode having a dielectric layer with an Rmax of 5 μm was employed, and a 20 W/cm² power (total power of 84 kW) was supplied at a frequency of 13.56 MHz employing a high frequency power source JRF-10000 produced by Nippon Densi Co., Ltd. as a power source.

Optical films 31 and 32 were prepared employing a roll electrode having a dielectric layer with an Rmax of 37 μm, and a roll electrode having a dielectric layer with an Rmax of 11 μm, respectively, wherein a 0.5 W/cm² power (total power of 2.1 kW) was supplied at a frequency of 50 kHz.

<<Reactive Gas>>

The composition of a mixed gas (reaction gas) used in the plasma treatment will be shown below.

| (Composition for forming a silicon oxide layer) | |
|---|---|
| Inert gas: argon | 98.25% by volume |
| Reactive gas 1: a hydrogen gas | 1.5% by volume |
| Reactive gas 2: tetramethoxysilane vapor (bubbled with argon gas) | 0.25% by volume |
| (Composition for forming a titanium oxide layer) | |
| Inert gas: argon | 98.9% by volume |
| Reactive gas 1: a hydrogen gas | 0.8% by volume |
| Reactive gas 2: tetraisopropoxytitanium vapor (liquid heated to 150° C. was bubbled with argon gas) | 0.3% by volume |

The surface b (the surface b of the film facing the stainless steel belt support at the dope casting) of each of film substrates 1 through 9 was subjected to continuous atmospheric pressure plasma treatment under the above conditions to form, on the surface b, four layers of a first high refractive index layer (refractive index: 2.3, layer thickness: 13 nm), a first low refractive index layer (refractive index: 1.44, layer thickness: 35 nm), a second high refractive index layer (refractive index: 2.3, layer thickness: 122 nm), and a second low refractive index layer (refractive index: 1.44, layer thickness: 89 nm) in that order.

Regarding the thus obtained optical film having an antireflection layer, reflectance thereof was measured and contamination occurring during the plasma treatment was observed.

In the optical films 22 through 30, the carbon content of each of the silicon oxide layer and the titanium oxide layer was 1.2% by weight, and in the optical films Nos. 31 and 32, the carbon content of each of the silicon oxide layer and the titanium oxide layer was 10.8% by weight, <<Measurement of Reflectance (Minimum Reflectance)>>

The spectral reflectance of the resulting optical film was measured under condition of a 5° regular reflection through a spectrophotometer TYPE 1U-4000 (produced by Hitachi Seisakusho Co., Ltd.). In order to prevent light reflection from the rear surface of the optical film opposite the observer side, the rear surface was surface-roughened, and subjected to light absorbing treatment employing with black spray to form a light absorbing layer. Reflectance of the resulting film was measured employing a wavelength of from 400 nm through 700 nm. As a result, inventive optical films 22 through 30 had a reflectance of less than 0.2, and had a flat reflection spectrum, and it was conformed that they had an excellent antireflection property. However, comparative optical films 31 and 32 did not sufficiently reduce reflectance. This is considered to result from the reduced refractive index and large variation of the layer thickness.

(Peeling Test)

A cross cut test was carried out according to a method as described in JIS K5400. Cross cuts of 11 lines at an interval of 1 mm were formed in the transverse and longitudinal directions through a single-edged razor on the layer surface to form one hundred grids. Then, a cellophane tape was adhered to the cross cut surface, and the tape was sharply peeled perpendicularly. The ratio of the peeled layer area to the tape adhered area was evaluated according to the following criteria:

A: No peeled layer was observed.
B: The ratio of the peeled layer area to the tape adhered area was less than 10%.
C: The ratio of the peeled layer area to the tape adhered area was not less than 10%.

<<Contamination During the Plasma Treatment>>

After the film substrate was subjected to plasma treatment, contamination in the plasma treatment chamber was observed according to the following four criteria.

A: No contamination was observed.
B: Slight contamination was observed, but not problematic.
C: Contamination was observed to the extent that cleaning was required.
D: Contamination was observed to the extent that troubles due to the contamination might occur.

TABLE 3

| | | Average reflectance | Contamination | Peeling test | Remarks |
|---|---|---|---|---|---|
| Optical film 22 | Film substrate 1 | 0.2% | C | A | Inv. |
| Optical film 23 | Film substrate 2 | 0.2% | B | A | Inv. |
| Optical film 24 | Film substrate 3 | 0.2% | B | A | Inv. |

TABLE 3-continued

| | | Average reflectance | Contamination | Peeling test | Remarks |
|---|---|---|---|---|---|
| Optical film 25 | Film substrate 4 | 0.2% | A | A | Inv. |
| Optical film 26 | Film substrate 5 | 0.2% | A | A | Inv. |
| Optical film 27 | Film substrate 6 | 0.2% | A | A | Inv. |
| Optical film 28 | Film substrate 7 | 0.2% | C | A | Inv. |
| Optical film 29 | Film substrate 8 | 0.2% | B | A | Inv. |
| Optical film 30 | Film substrate 9 | 0.2% | B | A | Inv. |
| Optical film 31 | Film substrate 2 | 3.5% | D | C | Comp. |
| Optical film 32 | Film substrate 2 | 5.1% | D | C | Comp. |

Inv.: Invention,
Comp.: Comparative

Example 3

<<Preparation of Optical Film>>

Optical films 33 through 43 were prepared employing film substrates 1 through 9 described in Table 1 and employing the same plasma discharge apparatus as in Example 1. The resulting optical films were evaluated for surface specific resistance, contamination occurring during the plasma treatment, and a peeling property. Details of the preparation were described below.

In the preparation of optical films 33 through 41, the surface roughness Rmax of the dielectric layer of a roll electrode used was 5 μm, a power source used was a high frequency power source JRF-10000 produced by Nippon Densi Co., Ltd., and power of 20 W/cm² (a total power of 84 kW) was supplied at voltage with a frequency of 13.56 MHz.

The surface roughness Rmax of the dielectric layer of the roll electrode was 37 μm in the preparation of optical film 42, and 11 μm in the preparation of optical film 43. Power of 0.5 W/cm² (a total power of 2.1 kW) was supplied at voltage with a frequency of 50 Hz in the preparation of optical films 42 and 43.

(Gas for Forming a Conductive Layer)
Inert gas: argon
Reactive gas: a mixed gas of tetrabutyltin (bubbled with argon)/triethyl indium (bubbled with argon)=1/1

TABLE 4

| | | Surface specific resistance Ω/□ | Contamination | Peeling test | Remarks |
|---|---|---|---|---|---|
| Optical film 33 | Film substrate 1 | 10⁴ | C | A | Inv. |
| Optical film 34 | Film substrate 2 | 10⁴ | B | A | Inv. |
| Optical film 35 | Film substrate 3 | 10⁴ | B | A | Inv. |
| Optical film 36 | Film substrate 4 | 10⁴ | A | A | Inv. |
| Optical film 37 | Film substrate 5 | 10⁴ | A | A | Inv. |
| Optical film 38 | Film substrate 6 | 10⁴ | A | A | Inv. |
| Optical film 39 | Film substrate 7 | 10⁴ | C | A | Inv. |
| Optical film 40 | Film substrate 8 | 10⁴ | B | A | Inv. |
| Optical film 41 | Film substrate 9 | 10⁴ | B | A | Inv. |
| Optical film 42 | Film substrate 2 | 10⁵ | D | B | Comp. |
| Optical film 43 | Film substrate 2 | 10⁷ | D | B | Comp. |

Inv.: Invention,
Comp.: Comparative

<<Surface Specific Resistance>>

The protective film for a polarizing plate was allowed to stand for 6 hours under condition of 23° C. and 55% RH, and then the surface specific resistance of the surface of the film was measured under the same condition as above, employing an insulation resistance meter (VE-30 TYPE produced by Kawaguchi Denki Co., Ltd. With respect to electrodes used for measurement, two electrodes (the surface area contacting the optical film being 1 cm×5 cm) were arranged in parallel with each other at an interval of 1 cm. The film was brought into contact with the electrodes and the surface specific resistance was measured. The resulting resistance value was multiplied by five and represented in terms of Ω/□ as a surface specific resistance.

Example 4

The conductive layer of each of optical films 33, 36 and 39 prepared in Example 3 was coated with coating composition (2) or (3), and further subjected to anti-reflection treatment, followed by formation of an anti-stain layer. Thus, optical films 44 through 49 were prepared.

<<Coating of Clear Hard Coat (CHC) Layer>>

The conductive layer of each of optical films 33, 36 and 39 above was gravure coated with the coating composition (2) described below, dried at 80° C. in a dryer, and irradiated with UV rays at 120 mJ/cm² to give a clear hard coat layer (a center-line average surface roughness Ra of 13 nm) with a dry thickness of 3 μm.

<<Anti-glare Layer Coating>>

The conductive layer of each of optical films 33, 36 and 39 above was gravure coated with the coating composition (3) described above, dried at 80° C. in a dryer, and irradiated with UV rays at 120 mJ/cm² to give an anti-glare layer (a center-line average surface roughness Ra of 0.25 μm) with a dry thickness of 3 μm.

| (Clear hard coat layer (CHC layer) coating composition) | |
|---|---|
| Dipentaerythritol hexacrylate monomer | 60 parts by weight |
| Dipentaerythritol hexacrylate dimmer | 20 parts by weight |
| Dipentaerythritol hexacrylate trimer or polymer higher than the trimer | 20 parts by weight |
| Dimethoxybenzophenone (photo-initiator) | 4 parts by weight |
| Ethyl acetate | 50 parts by weight |
| Methyl ethyl ketone | 50 parts by weight |
| Isopropyl alcohol | 50 parts by weight |

Further, a titanium oxide layer and a silicon oxide layer were formed on the clear hard coat layer (CHC layer) or the anti-glare layer in a similar manner as in Example 2, whereby anti-reflection treatment was carried out. That is, the CHC layer or the anti-glare layer of each film was subjected to continuous atmospheric pressure plasma treatment employing the plasma discharge apparatus used in Example 1 to form a titanium oxide layer (with a refractive index of 2.3 and a thickness of 13 nm), a silicon oxide layer (with a refractive index of 1.44 and a thickness of 35 nm), a titanium oxide layer (with a refractive index of 2.2 and a thickness of 122 nm), and a silicon oxide layer (with a refractive index of 1.44 and a thickness of 89 nm) on the layer in that order. Further, an anti-stain layer was formed on the resulting layer employing a reactive gas for anti-stain layer formation.

| (Reactive gas for anti-stain layer formation) | |
|---|---|
| Inert gas: argon | 99.8% by volume |
| Reactive gas: hexafluoropropylene | 0.2% by volume |

TABLE 5

| | Base Film | | Anti-reflection treatment | Anti-stain layer |
|---|---|---|---|---|
| Optical film 44 | Optical film 33 | CHC layer | Present | Present |
| Optical film 45 | Optical film 33 | Anti-glare layer | Present | Present |
| Optical film 46 | Optical film 36 | CHC layer | Present | Present |
| Optical film 47 | Optical film 36 | Anti-glare layer | Present | Present |
| Optical film 48 | Optical film 39 | CHC layer | Present | Present |
| Optical film 49 | Optical film 39 | Anti-glare layer | Present | Present |

The optical films obtained above had a uniform reflectance and fingerprints put on the films could be completely wiped off.

Example 5

A polarizing plate was prepared employing optical films 44 through 49 prepared in Example 4 according to the following procedures, and evaluated.

Inventive polarizing plate 44, in which optical film 44 was used as a polarizing plate protective film, was prepared according to the following procedures.

1. Preparation of Polarizing Film

A 120 μm thick long length polyvinyl alcohol film was uniaxially stretched (at 110° C. by a factor of 5). The resulting film was immersed for 60 seconds in an aqueous solution comprised of 0.075 g of iodine, 5 g of potassium iodide, and 100 g of water, further immersed at 68° C. in an aqueous solution comprised of 6 g of potassium iodide, 7.5 g of boric acid, and 100 g of water, washed with water, and dried. Thus, a long length polarizing film was obtained.

2. Preparation of Polarizing Plate

The polarizing film obtained above and polarizing plate protective film were laminated to obtain a polarizing plate sample according to the following procedures 1 to 5.

Procedure 1: The long length optical film 44 prepared in Example 4 was immersed in an aqueous 2 mol/liter sodium hydroxide solution at 60° C. for 90 seconds, washed with water, and dried. A peelable protective film (polyethylene terephthalate film) had been laminated in advance on the anti-reflection layer of the film in order to protect the anti-reflection layer. A long length cellulose ester film was immersed in an aqueous 2 mol/liter sodium hydroxide solution at 60° C. for 90 seconds, washed with water, and dried in a similar manner as above.

Procedure 2: The long length polarizing film obtained above was immersed in a polyvinyl alcohol adhesive (with a solid content of 2% by weight) for 1 to 2 seconds to form an adhesive layer.

Procedure 3: The excessive adhesive of the adhesive layer on the polarizing film prepared in Procedure 2 was softly removed. The resulting polarizing film was inserted between the optical film 44 and the cellulose ester film each being alkali treated in Procedure 1. Thus, laminate sample was obtained.

Procedure 4: The laminate sample was passed between the two rotating rollers at a pressure of from 20 to 30 N/cm$^2$, and at a speed of about 2 m/min. This process was carried out carefully not to introduce air foams in the laminate.

Procedure 5: The sample obtained in the Procedure 4 was dried at 80° C. for 2 minutes in a dryer. Thus, inventive polarizing plate 44 was prepared.

Subsequently, polarizing plates were prepared in the same manner as in polarizing plate 44, except that optical films 45 through 49 were used instead of optical film 44. Comparative polarizing plate 31 was prepared in the same manner as in polarizing plate 44, except that optical film 31 was used instead of optical film 44.

The polarizing plate on the viewer side of the liquid crystal cell of a commercially available display panel (a color liquid crystal display MultiSync LCD1525J TYPE LA-1529HM, produced by NEC Co., Ltd.) was peeled. Subsequently, each of the polarizing plates 44 through 49 and comparative polarizing plate 31 was adhered on the liquid crystal cell so that their polarizing direction was in accordance with the original one. Thus, liquid crystal display panels were obtained.

The resulting liquid crystal display panels were visually observed, and as a result, the liquid crystal panels employing inventive polarizing plates provided no unevenness of reflected light, exhibiting an excellent displaying property, as compared with the liquid crystal panel (comparative) employing comparative polarizing plate.

TABLE 6

| | Optical film used | Unevenness of reflected light | |
|---|---|---|---|
| Polarizing plate 44 | Optical film 44 | Not observed | Invention |
| Polarizing plate 45 | Optical film 45 | Not observed | Invention |
| Polarizing plate 46 | Optical film 46 | Not observed | Invention |
| Polarizing plate 47 | Optical film 47 | Not observed | Invention |
| Polarizing plate 48 | Optical film 48 | Not observed | Invention |
| Polarizing plate 49 | Optical film 49 | Not observed | Invention |
| Polarizing plate 31 | Optical film 31 | Apparently observed | Comparative |

Example 6

In the optical film 90 prepared by coating a TiO$_2$ layer with a thickness of 100 nm on film substrate 8 employing a vacuum coater LOAD-LOCK TYPE VACUUM ROLL COATER EWA-310 produced by Nippon Sinku Co., Ltd., and optical films 8A, 8C, 8D, 8F and 8N prepared in Example 1, the carbon content of the formed layer was measured according to the method described below. Further, these optical films were evaluated for an anti-abrasion property.

<<Measurement of Carbon Content>>

The carbon content was measured employing an XPS surface analyzer. The XPS surface analyzer used is not specifically limited, and any kinds of surface analyzers can be used, but in the examples, ESCALAB-200R produced by VG Scientifics Co., Ltd. was employed. Measurement was made at an output of 600 W (an acceleration voltage of 15 kV, and emission current of 40 mA), employing Mg as an X ray anode. Energy dissolution regulated to a peak width at half height of clean Ag 3d5/2 was set to be 1.5 to 1.7 eV. In order to eliminate an influence due to contamination, it is necessary that before measurement, a surface layer corresponding to 10 to 20% of the formed layer thickness be removed by etching. The surface layer is preferably removed employing an ion gun capable of using a rare gas ion. Examples of the ion include an ion of He, Ne, Ar, Xe, or Kr. In this example, the surface layer was removed employing argon ion etching.

Measurement was made at a measurement interval of 1.0 eV in the bond energy range of 0 to 1100 eV, and firstly, an element to be detected was examined. Next, measurement was made at a measurement interval of 0.2 eV on each of the detected elements except for the element for etching, and a narrow scanning of the photo-electron peak providing a maximum intensity was carried out. Thus, the spectrum of each element was obtained. In order to eliminate variation of the carbon content obtained due to kinds of analyzers or computers employed, the resulting spectrum was transferred to COMMON DATA PROCESSING SYSTEM (preferably Version 2.3 or Versions thereafter) produced by VAMAS-SCA-JAPAN Co., Ltd., and processed with its software to obtain a carbon content in terms of atomic concentration.

Before quantitative processing, calibration of Count Scale on each element detected was carried out, and 5 point smoothing processing was carried out. In the quantitative processing, the peak area intensity (cps·eV) except for the background was employed. The background processing was carried out employing a Shirley method. The Shirley method was described in D. A. Shirley, Phys. Rev., B5, 4709 (1972).

<Measurement of Anti-abrasion Property>

A 1×1 cm$^2$ probe to which a steel wool was adhered was put on the layer of the optical films, loaded with a 250 g load, and reciprocated 10 times. The number of abrasion lines was counted.

TABLE 7

| Optical film | Coating method | Carbon content weight % | Anti-abrasion property | Remarks |
|---|---|---|---|---|
| Optical film 8A | Atmospheric pressure plasma | 5 | 1 | Invention |
| Optical film 8C | Atmospheric pressure plasma | 3 | 0 | Invention |
| Optical film 8D | Atmospheric pressure plasma | 0.3 | 0 | Invention |

TABLE 7-continued

| Optical film | Coating method | Carbon content weight % | Anti-abrasion property | Remarks |
|---|---|---|---|---|
| Optical film 8F | Atmospheric pressure plasma | 0.2 | 1 | Invention |
| Optical film 8I | Atmospheric pressure plasma | 23 | 34 | Comparative |
| Optical film 8N | Atmospheric pressure plasma | 7 | 21 | Comparative |
| Optical film 90 | Vacuum deposition | Not detected | 27 | Comparative |

Example 7

<<Preparation of Optical Film>>

Optical films 50 through 55 were prepared employing film substrate 8 as shown in Table 1 and the plasma discharge apparatus used in Example 1, except that inventive dielectric coated electrode set B was replaced with the inventive dielectric coated electrode set A, and the discharge surface area, power supplied, and voltage applying method were as shown in Table 8.

Details of the preparation will be described below.

In the above preparation, the discharge surface area was adjusted by changing the length in the transverse direction of the electrodes to 100 cm (the width of film substrate was also changed), and varying the length in the transport direction of the prismatic electrodes and the number used thereof.

<<Voltage Applying Method>>

Continuous sine-shaped wave: frequency of 13.56 MHz

<<Reactive Gas>>

The composition of a mixed gas (reactive gas) used in the plasma treatment is shown below.

| (Composition for forming titanium oxide layer) | |
|---|---|
| Inert gas: argon | 98.8% by volume |
| Reactive gas 1: a hydrogen gas | 1.0% by volume |
| Reactive gas 2: tetraisopropoxytitanium vapor (liquid heated to 150° C. was bubbled with argon gas) | 0.2% by volume |

The surface b of film substrate 8 (the surface of the film facing the stainless steel belt support at the dope casting) was subjected to atmospheric pressure plasma treatment under the above conditions to form a layer (with a refractive index of 2.3 and a thickness of 100 nm) containing a titanium oxide as a main component. The thus obtained optical films were evaluated for layer thickness deviation and refractive index distribution. The results are shown in Table 8.

<Evaluation of Layer Thickness Deviation>

The layer thickness was measured according to the thickness measuring method as carried out in Example 1. The layer thicknesses were measured at 99 points at an interval of 1 cm between a length of 100 cm in the transverse direction of the optical film, and the layer thickness deviation was obtained from the resulting layer thicknesses.

Layer thickness deviation =

$$\frac{\text{Measuring number} \cdot \sum (\text{Thickness})^2 - \left(\sum (\text{Thickness})^2\right)}{\text{Measuring number} \cdot (\text{Measuring number} - 1)}$$

<Evaluation of Refractive Index Distribution>

The refractive index was measured according to the refractive index measuring method as carried out in Example 1. The refractive indexes were measured at 99 points at an interval of 1 cm between a length of 100 cm in the transverse direction of the optical film, and the refractive index distribution was obtained from the resulting refractive indexes.

Refractive index distribution =

$$\frac{\text{Measuring number} \cdot \sum (\text{refractive index})^2 - \left(\sum (\text{refractive index})^2\right)}{\text{Measuring number} \cdot (\text{Measuring number} - 1)}$$

TABLE 8

| Sample No. | Length in the transport direction of discharge surface (cm) | Length in the transport direction of discharge surface/ Length in the transverse direction of discharge surface | Discharge surface area cm² | Output density W/cm² | Total power supplied | Layer thickness deviation % | Refractive index distribution |
|---|---|---|---|---|---|---|---|
| 50 | 5 | 1/20 | 500 | 15 | 7.5 kw | ±3.5 | 2.21 ± 0.11 |
| 51 | 8 | 2/25 | 800 | 15 | 12 kw | ±3.0 | 2.23 ± 0.11 |
| 52 | 10 | 1/10 | 1000 | 15 | 15 kw | ±1.0 | 2.24 ± 0.10 |
| 53 | 20 | 1/5 | 2000 | 15 | 30 kw | ±0.8 | 2.28 ± 0.03 |
| 54 | 50 | 1/2 | 5000 | 15 | 75 kW | ±0.5 | 2.30 ± 0.02 |
| 55 | 100 | 1/1 | 10000 | 15 | 150 kW | ±0.4 | 2.32 ± 0.02 |

The total power exceeding 15 kW can provide excellent refractive index distribution. Further, it has been proved that when length in the transport direction of discharge surface/ length in the transverse of discharge surface of not less than 1/10, the layer thickness deviation is reduced, which provides a uniform layer thickness.

INDUSTRIAL APPLICATION

The present invention provides an electrode system capable of resisting high voltage and high output, can carry out stable discharge treatment capable of resisting production over a long time, and can provide a uniform layer with high performance at a high speed.

What is claimed is:

1. A layer forming method comprising the steps of:
supplying power of not less than 1 W/cm2 at a high frequency voltage exceeding 100 kHz across a gap formed between a first and a second electrode opposed to each other at approximately atmospheric pressure to induce a discharge, and thereby generating a reactive gas in a plasma state by the discharge; and exposing a substrate to the reactive gas in a plasma state to form a layer on the substrate;

wherein at least one of the first and second electrode is a dielectric coated electrode which comprises a conductive base material coated with a dielectric layer having a void volume of not more than 10%;

said dielectric layer being provided by thermally spraying ceramic on the conductive base, the ceramic layer being sealed with an organic compound and the organic compound being hardened by a sol-gel reaction.

2. The layer forming method of claim 1, wherein the dielectric layer has a surface roughness Rmax of not more than 10 μm.

3. The layer forming method of claim 2, wherein the surface of the dielectric layer is surface finished by polishing treatment.

4. The layer forming method of claim 2, wherein the dielectric layer has a surface roughness Rmax of not more than 8 μm.

5. The layer forming method of claim 4, wherein the dielectric layer has a surface roughness Rmax of not more than 7 μm.

6. The layer forming method of claim 1, wherein the sol-gel reaction is accelerated by energy treatment.

7. The layer forming method of claim 6, wherein the energy treatment is heat treatment at not more than 200° C. or UV radiation treatment.

8. The layer forming method of claim 1, wherein the inorganic compound after the sol-gel reaction contains not less than 60 mol % of SiOx.

9. The layer forming method of claim 1, wherein the dielectric coated electrode has a heat resistant temperature of not less than 100° C.

10. The layer forming method of claim 1, wherein the difference in a linear thermal expansion coefficient between the conductive base material and the dielectric layer in the dielectric coated electrode is not more than $10 \times 10^{-6}/°C$.

11. The layer forming method of claim 1, wherein the dielectric layer has a thickness of from 0.5 to 2 μm.

12. The layer forming method of claim 1, wherein the dielectric layer has a dielectric constant of from 6 to 45.

13. The layer forming method of claim 1, wherein the dielectric layer has a centerline average surface roughness Ra of not more than 0.5 μm.

14. The layer forming method of claim 13, wherein the dielectric layer has a centerline average surface roughness Ra of not more than 0.1 μm.

15. The layer forming method of claim 1, wherein the dielectric layer has a void volume of not more than 8%.

* * * * *